United States Patent
Oohira

(10) Patent No.: US 7,855,554 B2
(45) Date of Patent: Dec. 21, 2010

(54) SEMICONDUCTOR DEVICE, MAGNETIC SENSOR, AND PHYSICAL QUANTITY SENSOR

(75) Inventor: Satoshi Oohira, Gifu (JP)

(73) Assignee: Denso Corporation, Kariya (JP)

( * ) Notice: Subject to any disclaimer, the term of this patent is extended or adjusted under 35 U.S.C. 154(b) by 838 days.

(21) Appl. No.: 11/798,639

(22) Filed: May 15, 2007

(65) Prior Publication Data
US 2008/0074106 A1 Mar. 27, 2008

(30) Foreign Application Priority Data

| Jun. 2, 2006 | (JP) | ............................. 2006-154803 |
| Mar. 27, 2007 | (JP) | ............................. 2007-081376 |

(51) Int. Cl.
*G01R 33/07* (2006.01)

(52) U.S. Cl. .................................... 324/251; 324/207.2

(58) Field of Classification Search ............ 324/207.12, 324/207.2, 209, 225, 251; 338/32 R, 32 H
See application file for complete search history.

(56) References Cited

U.S. PATENT DOCUMENTS

| 5,257,210 | A | 10/1993 | Schneider et al. |
| 5,351,003 | A | 9/1994 | Bauer et al. |
| 5,621,320 | A * | 4/1997 | Yokotani et al. ............. 324/252 |
| 6,177,793 | B1 * | 1/2001 | Shinjo et al. ............ 324/207.25 |
| 6,522,131 | B1 * | 2/2003 | Hiligsmann et al. ...... 324/207.2 |
| 2003/0117254 | A1 | 6/2003 | Wan et al. |
| 2005/0258820 | A1 * | 11/2005 | Forster ........................ 324/165 |
| 2006/0170406 | A1 * | 8/2006 | Kawashima et al. ........ 323/294 |

FOREIGN PATENT DOCUMENTS

| DE | 44 34 318 | 3/1996 |
| JP | A-2-120680 | 5/1990 |
| JP | A-3-252578 | 11/1991 |
| JP | A-7-294561 | 11/1995 |
| JP | A-11-211411 | 8/1999 |
| JP | A-2000-046878 | 2/2000 |
| JP | A-2004-053505 | 2/2004 |

OTHER PUBLICATIONS

Office Action dated Jan. 9, 2009 in corresponding Chinese patent application No. 2007101065499 (and English translation).
Office Action dated Feb. 17, 2009 in corresponding German patent application No. 10 2007 024 436.5-35 (and English translation).
Kazusuke Maenaka et al., "*Integrated Three Dimensional Magnetic Sensors*", T. IEE; Japan, vol. 109-C, No. 7, pp. 483-490. [Partial translation].
Kazusuke Maenaka et al., "*Characteristics of Vertical Hall Cells and Improvement of Their Sensitivity*", T. IEE; Japan, vol. 117-E, No. 7, pp. 364-770. [English abstract].

* cited by examiner

*Primary Examiner*—Bot L LeDynh
(74) *Attorney, Agent, or Firm*—Posz Law Group, PLC

(57) ABSTRACT

A semiconductor device includes: a detection Hall element for detecting a magnetic field; a temperature monitor Hall element; and a calculation circuit. The detection Hall element has a characteristic, which is almost a same as the temperature monitor Hall element. The detection Hall element is disposed near the temperature monitor Hall element. The detection Hall element outputs a Hall voltage. The temperature monitor Hall element includes a pair of driving signal supply terminals for outputting a temperature monitor voltage. The calculation circuit calculates to cancel a temperature characteristic of the Hall voltage based on the Hall voltage and the temperature monitor voltage.

6 Claims, 12 Drawing Sheets

SEMICONDUCTOR DEVICE, MAGNETIC SENSOR, AND PHYSICAL QUANTITY SENSOR

CROSS REFERENCE TO RELATED APPLICATIONS

This application is based on Japanese Patent Applications No. 2006-154803 filed on Jun. 2, 2006, and No. 2007-81376 filed on Mar. 27, 2007, the disclosures of which are incorporated herein by reference.

FIELD OF THE INVENTION

The present invention relates to a semiconductor device, a magnetic sensor, and a physical quantity sensor.

BACKGROUND OF THE INVENTION

A magnetic sensor for detecting a physical quantity can detect motion such as movement, rotation, etc. of a detection object constructed by a magnetic substance in non-contact. Accordingly, for example, the magnetic sensor is used in a throttle valve aperture sensor, etc. of a vehicle mounting internal combustion engine as an angle detecting sensor. In particular, the magnetic sensor constructed by arranging a Hall element as an element for utilizing the Hall effect can also distinguish a magnetic pole. Therefore, this magnetic sensor is also widely utilized in a magnetic pole sensor, etc. of a brushless motor. First, a magnetic field detection principle of this Hall element will be explained with reference to FIG. 16.

When a magnetic field perpendicular to a carrier moved within a semiconductor is applied, electromotive force is generated within the semiconductor in a direction perpendicular to both the carrier and the magnetic field by Lorentz force. This electromotive force is called a Hall voltage. Concretely, as shown in FIG. 16, for example, in the Hall element 100 of width W, length L and thickness d, when a driving electric current I is flowed from terminal TI1 to terminal TI2 and the magnetic field of magnetic flux density B is applied to this Hall element 100, Hall voltage Vh shown by the following relation formula:

$$Vh = (Rh \times I \times B/d) \times \cos \theta$$

is generated between terminal V1 and terminal V2. Here, angle θ is an angle formed between the Hall element 100 and a direction of the magnetic field. Further, Rh is a Hall coefficient, and is a value shown by the relation formula of $Rh = 1/(q \times n)$ when an electric charge is q and a carrier density is n.

Thus, the Hall voltage Vh generated in the Hall element becomes a function of magnetic flux density B and angle θ. Therefore, the strength of the applied magnetic field and the direction (angle θ) of the magnetic field can be detected in accordance with the magnitude of this Hall voltage Vh.

A lateral Hall element described in e.g., "Integrated three-dimensional magnetic sensor" published in Electricity Society thesis journal C, Vol. 109, No. 7, pp. 483-490 in 1989 is known as a general Hall element. This lateral Hall element detects a magnetic field component perpendicular to the surface of a substrate (i.e., wafer). Here, the structure and magnetic field detecting principle of this lateral Hall element will be explained. FIG. 17A typically shows a planar structure of this lateral Hall element. FIG. 17B typically shows a sectional structure of this lateral Hall element along XVIIB-XVIIB within FIG. 17A.

As shown in FIGS. 17A and 17B, this lateral Hall element is constructed by arranging a semiconductor support layer (P-sub) 110 constructed by e.g., silicon of P-type, and a semiconductor layer (N-well) 111 of N-type formed through ion implantation to a surface portion of this semiconductor support layer 110. On the surface of the semiconductor layer 111, electrode a and electrode b for supplying a driving electric current, and electrode c and electrode d for detecting the Hall voltage are arranged at four corners in a mode opposed to each other. Further, on the surface of the semiconductor layer 111, N-type diffusion layers 112a to 112d constructed by N-type higher in concentration than this semiconductor layer 111 are formed to form ohmic contact with these electrodes a to d.

Here, for example, when a driving electric current I is supplied between electrode a and electrode b, this driving electric current I is flowed in a horizontal direction with respect to the surface of the semiconductor layer 111. In a state in which the driving electric current I is flowed in this way, as shown by arrows in FIGS. 17A and 17B, when a magnetic field (magnetic flux density B) including a component perpendicular to the surface of the semiconductor layer 111 is applied, the above Hall voltage Vh is generated between electrode c and electrode d. The magnetic field component perpendicular to the surface of the semiconductor layer 111 can be detected by detecting this Hall voltage Vh.

Further, in recent years, a Hall element for detecting a horizontal magnetic field component with respect to the substrate (wafer) surface is also proposed. A Hall element similarly described in e.g., "Integrated three-dimensional magnetic sensor" published in Electricity Society thesis journal C, Vol. 109, No. 7, pp. 483-490 in 1989, and "Characteristic and high sensitivity formation of vertical Hall element" published in Electricity Society thesis journal E, Vol. 117, No. 7, pp. 364-370 in 1997, a so-called vertical Hall element is known as such a Hall element. Next, the structure and magnetic field detecting principle of this vertical Hall element will be schematically explained with reference to FIGS. 18 and 19. FIG. 18 typically shows a planar structure of this vertical Hall element. FIG. 19 typically shows a sectional structure of this vertical Hall element along XIX-XIX within FIG. 18.

As show in FIG. 19 illustrating this sectional structure, this vertical Hall element is constructed by arranging a semiconductor support layer (P-sub) 120 constructed by e.g., silicon of P-type, an N-type (N+) embedded layer BL buried and formed on the surface of this semiconductor support layer 120, and a semiconductor layer 121 of N-type formed on this N-type embedded layer BL by epitaxial growth. Impurity concentration of the above N-type embedded layer BL formed on the surface of the semiconductor support layer 120 is set to concentration higher than that of the above semiconductor layer 121.

In the semiconductor layer 121, a diffusion layer 122 of P-type is formed in a square sleeve shape so as to be connected to the above semiconductor support layer 120. On an inner circumferential face of this diffusion layer 122, diffusion layers 123, 124 of the same P-type are formed so as to be connected to the above N-type embedded layer BL. The semiconductor layer 121 is divided into three areas 125a to 125c approximately formed in a rectangular parallelepiped shape by diffusion layers 122 to 124. On the surface of the area 125a located at the center among these areas 125a to 125c, three diffusion layers 126a, 126d, 126e of N-type (N+) are formed on a straight line with the diffusion layer 126a as a center. On the other hand, a diffusion layer 126b of N-type (N+) is formed at the surface center of the area 125b, and a diffusion layer 126c of the same N-type (N+) is formed at the surface center of the area 125c. Namely, as shown in FIG. 19, the above diffusion layer 126a is arranged so as to be opposed to each of the diffusion layer 126b and the diffusion layer 126c through the above diffusion layer 123 and the above diffusion layer 124. The above diffusion layers 126a to 126e function as a contact area, and are respectively electrically connected to terminal S, terminal G1 terminal G2, terminal V1 and terminal V2. In this vertical Hall element, as shown by a broken line within FIG. 18, an area nipped by the above diffusion layer 126d and diffusion layer 126e in an area electrically partitioned within the substrate of the above area 125a becomes a so-called Hall plate HP.

Here, for example, when a constant driving electric current is flowed from terminal S to terminal G1 and is also flowed from terminal S to terminal G2, this driving electric current is respectively flowed from the diffusion layer 126a of the surface of the semiconductor layer 121 into the diffusion layer 126b and the diffusion layer 126c through the above Hall plate HP and the N-type embedded layer BL. Namely, the driving electric current mainly including a component perpendicular to the substrate surface is flowed to the above Hall plate HP. Thus, in a flowing state of the driving electric current, as shown by arrows within FIGS. 18 and 19, when a magnetic field (magnetic flux density B) including a component parallel to the surface of the semiconductor layer 121 is applied, the above Hall voltage Vh is generated between terminal V1 and terminal V2. A magnetic field component parallel to the surface of the semiconductor layer 121 can be detected by detecting this Hall voltage Vh.

In such a vertical Hall element, in addition to this, there is also an element having a structure able to be manufactured through a CMOS process. In accordance with the vertical Hall element able to be manufactured through this CMOS process, manufacture cost is reduced in comparison with the vertical Hall element manufactured through a bipolar process, and high integration is easily performed. Accordingly, various correction circuits of high precision can be mounted onto the same chip. Next, the vertical Hall element of this kind will be schematically explained with reference to FIGS. 20 and 21. FIG. 20 typically shows a planar structure of this vertical Hall element. FIG. 21 typically shows a sectional structure of the same vertical Hall element along XXI-XXI within FIG. 20.

As shown in FIG. 21, this vertical Hall element is constructed by arranging a semiconductor support layer (P-sub) 130 constructed by e.g., silicon of P-type, and a semiconductor area (Nwell) 131 of N-type formed as a diffusion layer (well) by introducing e.g., electric conductivity type impurities of N-type on the surface of the semiconductor support layer 130. Further, as shown in FIG. 20 illustrating its planar structure, in this semiconductor support layer 130, a diffusion layer (Pwell) 132 of P-type is formed as a diffusion separating wall so as to surround the above semiconductor area 131. Diffusion layers (Pwell) 133, 134 of P-type having a diffusion depth shallower than that of the above semiconductor area 131 are formed on an inner circumferential face of this diffusion layer 132. The surface vicinity of the semiconductor area 131 is divided into three areas 135a to 135c approximately formed in a rectangular parallelepiped shape by these diffusion layers 132 to 134. In this vertical Hall element, on the surface of the area 135a located at the center, three diffusion layers 136a, 136d, 136e of N-type (N+) are also formed on a straight line with the diffusion layer 136a as a center. On the other hand, a diffusion layer 136b of N-type (N+) is formed at the surface center of the area 135b, and a diffusion layer 136c of N-type (N+) is formed at the surface center of the area 135c. In this vertical Hall element, as shown by a broken line within FIG. 20, an area nipped by the above diffusion layer 136d and the above diffusion layer 136e in an area electrically partitioned in the substrate interior of the above area 135a becomes a Hall plate HP.

In the vertical Hall element having such a structure, when a constant driving electric current is flowed from terminal S to terminal G1 and is also flowed from terminal S to terminal G2, the driving electric current mainly including a component perpendicular to the surface of the semiconductor area 131 is also flowed to the above Hall plate HP. Therefore, a magnetic field component parallel to the surface of the above semiconductor area 131 can be also detected by the vertical Hall element of such a structure through the detection of the Hall voltage Vh.

Here, as shown in FIG. 22A, two magnets MG1, MG2 formed in a curved shape are fixed to a rotating body. A Hall element 140 is arranged at the center within an area nipped by the N-pole of the magnet MG1 and the S-pole of the magnet MG2. A detecting mode of a rotation angle will be explained when the magnetic field of a direction shown by an arrow within this figure is applied to the Hall element 140. In such a construction, when only the rotating body fixing the two magnets MG1, MG2 thereto is rotated, as shown in the upper view of FIG. 22B, the Hall voltage Vh changed in a sine wave shape in accordance with the rotation angle of the rotating body is outputted from the Hall element 140. This Hall voltage Vh and the rotation angle theoretically have one-to-one corresponding relation. Therefore, the rotation angle of the rotating body can be calculated on the basis of the above Hall voltage Vh outputted from the Hall element 140. However, in the real use, as shown by the lower view of FIG. 22B, only a voltage value within an area AR for linearly changing the Hall voltage Vh with respect to the transition of the rotation angle among the Hall voltage Vh thus obtained is used in the detection of the rotation angle to reduce arithmetic load applied in the detection of the rotation angle and improve detection accuracy, etc.

On the other hand, as shown as a line segment R in FIG. 22C, the Hall voltage Vh actually detected is separated from a line segment T showing the above theoretical Hall voltage Vh by various error factors in the real situation. The following two factors are mainly considered as this factor.

The existence of an offset voltage is enumerated as a first factor. The offset voltage is a voltage applied when no magnetic field is applied (magnetic flux density B=0). When no magnetic field is applied to the Hall element, it is ideal that the offset voltage becomes "zero". However, in reality, even when no magnetic field is applied to the Hall element, a voltage (offset voltage) for entirely raising the Hall voltage Vh is generated. Therefore, as shown by a one-dotted chain line within FIG. 22C, an output voltage from the Hall element is entirely raised by the offset voltage in comparison with the original Hall voltage Vh. There are the following matters as a generating factor of such an offset voltage.

The offset voltage is generated by an alignment shift when the Hall element is manufactured. In the previous FIG. 18, when a shift is caused in alignment of diffusion layers 122 to 124 and diffusion layers 126a to 126e and the relative position relation of diffusion layers 122 to 124 and diffusion layers 126a to 126e is shifted, an offset is caused in the flow of the driving electric current from terminal S to terminal G1 and terminal G2. An equipotential line within the Hall element is deformed by this offset of the driving electric current. Therefore, the offset voltage is generated between electrode c and electrode d.

The offset voltage is also generated by external mechanical stress. A package (an adhesive of mold, silver paste, etc.) for sealing the Hall element is enumerated as a factor of the mechanical stress generation. When the external mechanical stress is applied to the Hall element, a resistance value within the Hall element is changed by a piezo resistance effect. Such mechanical stress is not uniformly applied to the Hall element. Therefore, an unbalance is generated with respect to the resistance value within the Hall element. This unbalance of the resistance value within the Hall element appears as the offset voltage.

Temperature characteristics of the magnet for applying the magnetic field to the Hall element and temperature characteristics of the Hall element itself are enumerated as a second factor.

A voltage as shown by a two-dotted chain line within FIG. 22C is finally outputted from the Hall element by these factors.

A change of the Hall voltage Vh generated by the existence of such an offset voltage and the temperature characteristics is generally corrected by using a correction circuit. In this change, the above change due to the offset voltage is generated by a mechanical factor of the structure of the Hall element, etc. Therefore, there are many cases in which it is sufficient to make a correction by only once through the correction circuit. Accordingly, it is not seen as a problem so much in the angular detection using the Hall element. On the other hand, with respect to the above change caused by temperature characteristic, the correction every each temperature is required so that its correction is complicated and cannot be also neglected from a viewpoint of improvement of detection accuracy of the Hall element More particularly, temperature characteristics of the magnet for applying the magnetic field to the above Hall element and temperature characteristics of the Hall element itself, i.e., the relation of the Hall voltage Vh and temperature is generally represented by a secondary function. Therefore, it is necessary to increase the number of times of the correction of the Hall voltage Vh made every temperature and make a curve correction in the secondary function to detect the magnetic field of high precision by correcting the change of the Hall voltage Vh using such temperature characteristics. However, if the number of times of the correction is increased, time until the calculation of the magnitude of the magnetic field applied to the same Hall element from the Hall voltage is increased. Further, if the curve correction is made, a circuit scale is increased and an increase of a chip size is caused. Therefore, in each case, non-efficiency is caused.

In particular, in the above vertical Hall element, as shown below, a spreading method of a depletion layer is different in accordance with temperature. Therefore, a bending degree of a curve showing the relation of temperature and the Hall voltage in the above temperature characteristic tends to be more emphasized, and the correction of the Hall voltage caused by the temperature characteristic is more complicated. Further, the width of the depletion layer is also dispersed by dispersion of the diffusion layer in manufacture. Therefore, dispersion of the Hall voltage every individual also becomes large.

Namely, in the vertical Hall element, as shown by a broken line in FIG. 23, when the driving electric current is flowed to the same element, depletion layers are respectively generated in a PN junction portion between the semiconductor area 131 and diffusion layers 133, 134 and a PN junction portion between the semiconductor area 131 and the diffusion layer 132. The sizes of these depletion layers are also changed in accordance with temperature. Further, in the vertical Hall element, diffusion concentration of the diffusion layer is thin. Therefore, the above depletion layer is more easily spread in two directions (horizontal direction in this figure) with respect to the direction of the electric current, and the shape of the Hall plate HP is easily distorted. As shown in FIG. 24, temperature dependence more notably appears in the vertical Hall element from such reasons. It becomes difficult to precisely correct the change of the Hall voltage caused by the temperature characteristic.

Accordingly, a sensor able to correct the change of the output voltage caused by the temperature characteristic on the basis of high accuracy is required.

SUMMARY OF THE INVENTION

In view of the above-described problem, it is an object of the present disclosure to provide a semiconductor device. It is another object of the present disclosure to provide a magnetic sensor. It is further another object of the present disclosure to provide a physical quantity sensor.

In accordance with a first aspect of the present disclosure, a semiconductor device is constructed by a detection Hall element for detecting a magnetic field emitted from a detection object, a temperature monitor Hall element, and a calculation circuit. The detection Hall element approximately has the same characteristic as the temperature monitor Hall element. The detection Hall element is arranged near the temperature monitor Hall element. The detection Hall element outputs a Hall voltage. The temperature monitor Hall element has a pair of driving signal supply terminals for outputting a temperature monitor voltage. The calculation circuit makes an arithmetic calculation for canceling the temperature characteristic of the Hall voltage on the basis of the Hall voltage and the temperature monitor voltage.

An arithmetic calculation for canceling the temperature characteristic can be made between the Hall voltage and the temperature monitor voltage. The above sensor output obtained through such an arithmetic calculation also becomes a voltage having a characteristic naturally excellent in linearity with respect to the temperature change. Therefore, when an interpolation correction, etc. based on temperature with respect to the above sensor output are made, its accuracy is suitably maintained. Accordingly, the change of the Hall voltage caused by the temperature characteristic can be corrected on the basis of high accuracy.

In accordance with a second aspect of the present disclosure, the magnetic sensor is constructed by a Hall element, a switching element and a calculation circuit. The Hall element detects a magnetic field emitted from a detection object. The Hall element has a driving signal supply terminal for outputting the Hall voltage and outputting the temperature monitor voltage. The switching element switches the output of the Hall voltage and the output of the temperature monitor voltage. The calculation circuit makes an arithmetic calculation for canceling the temperature characteristic of the Hall voltage on the basis of the Hall voltage and the temperature monitor voltage.

In accordance with the above construction, an arithmetic calculation for canceling the temperature characteristics of the switched and outputted Hall voltage and temperature monitor voltage is made by these voltages. The above sensor output obtained through such an arithmetic calculation also becomes a voltage having a characteristic naturally excellent in linearity with respect to the temperature change. Therefore, when an interpolation correction, etc. based on temperature with respect to the above sensor output are made, its accuracy is suitably maintained, and the change of the Hall voltage caused by the temperature characteristic can be corrected on the basis of high accuracy.

In accordance with a third aspect of the present disclosure, the magnetic sensor is constructed by a detection Hall element for detecting a magnetic field emitted from a detection object, a temperature monitor element, and a calculation circuit. The detection Hall element is arranged near the temperature monitor element. The detection Hall element outputs an offset voltage. The temperature monitor element has a pair of driving signal supply terminals for outputting the temperature monitor voltage. The calculation circuit makes an arithmetic calculation for canceling the temperature characteristic of the Hall voltage on the basis of the Hall voltage and the temperature monitor voltage.

A sensor output for correcting the temperature characteristic and canceling the offset is obtained by arithmetically calculating the Hall voltage and the temperature monitor voltage.

In accordance with a fourth aspect of the present disclosure, a physical quantity sensor is constructed by a first detection device for detecting a physical quantity according to a detection object, a second detection device for monitoring temperature, and a calculation circuit. The first detection device is constructed by one element equivalently shown as a bridge circuit, or plural elements constituting the bridge circuit. The second detection device is arranged near the first detection device. The second detecting circuit is constructed by one element equivalently shown as a bride circuit, or plural elements constituting the bridge circuit. The first detection device outputs a detection voltage according to the physical quantity. The second detection device has a pair of driving signal supply terminals for outputting the temperature monitor voltage. The calculation circuit makes an arithmetic calculation for canceling the temperature characteristic of the detection voltage on the basis of the detection voltage and the temperature monitor voltage.

The above sensor output obtained through the arithmetic calculation also becomes a voltage having a characteristic naturally excellent in linearity with respect to the temperature change. Accordingly, the change of the detection voltage caused by the temperature characteristic can be corrected on the basis of high accuracy.

In accordance with a fifth aspect of the present disclosure, a physical quantity sensor is constructed by a detection device for detecting a physical quantity according to a detection object and monitoring temperature, and a calculation circuit. The detection device is constructed by one element equivalently shown as a bridge circuit, or plural elements constituting the bridge circuit. The detection device outputs a detection voltage according to the physical quantity. The detection device has a pair of driving signal supply terminals for outputting the temperature monitor voltage. The calculation circuit makes an arithmetic calculation for canceling the temperature characteristic of the detection voltage on the basis of the detection voltage and the temperature monitor voltage.

Accordingly, an arithmetic calculation for canceling the temperature characteristic can be made between the detection voltage and the temperature monitor voltage. The above sensor output obtained through such an arithmetic calculation also becomes a voltage having a characteristic naturally excellent in linearity with respect to the temperature change. Therefore, the change of the detection voltage caused by the temperature characteristic can be corrected on the basis of high accuracy.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment Mode

A first embodiment mode for embodying a magnetic sensor will next be explained with reference to FIGS. 1 to 5. In the magnetic sensor in accordance with this embodiment mode, the above vertical Hall element is adopted as an element for detecting magnetism.

Figure 1:
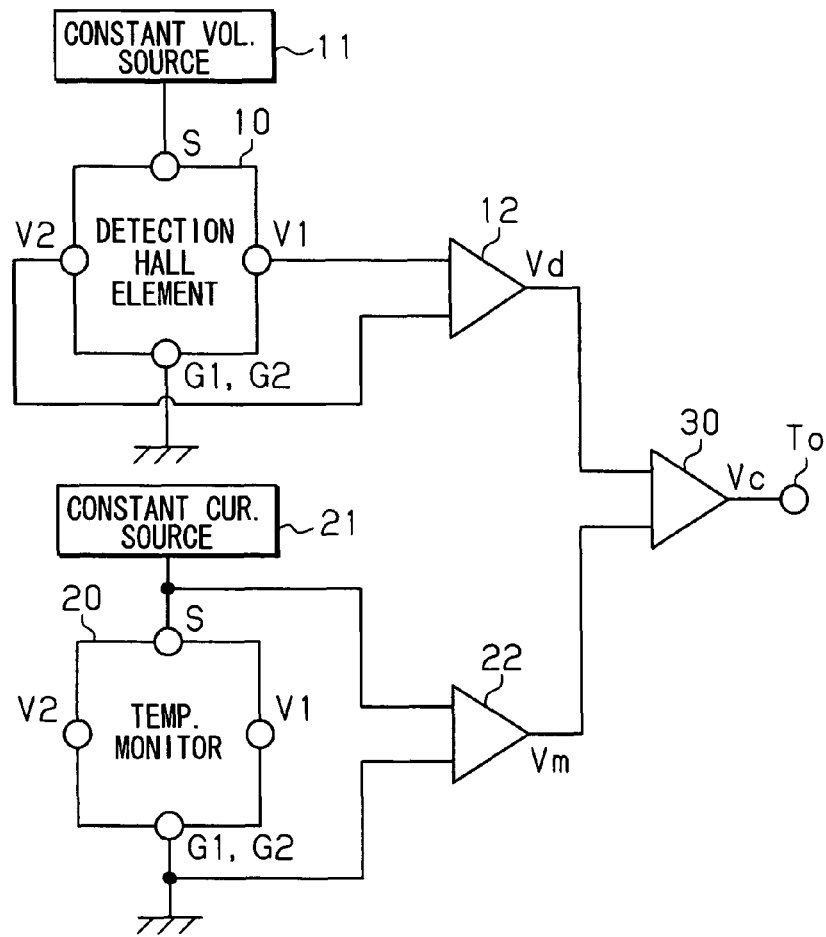
FIG. 1 is a circuit diagram and shows a circuit construction as its main with respect to a first embodiment mode of a magnetic sensor.
Figure 20:
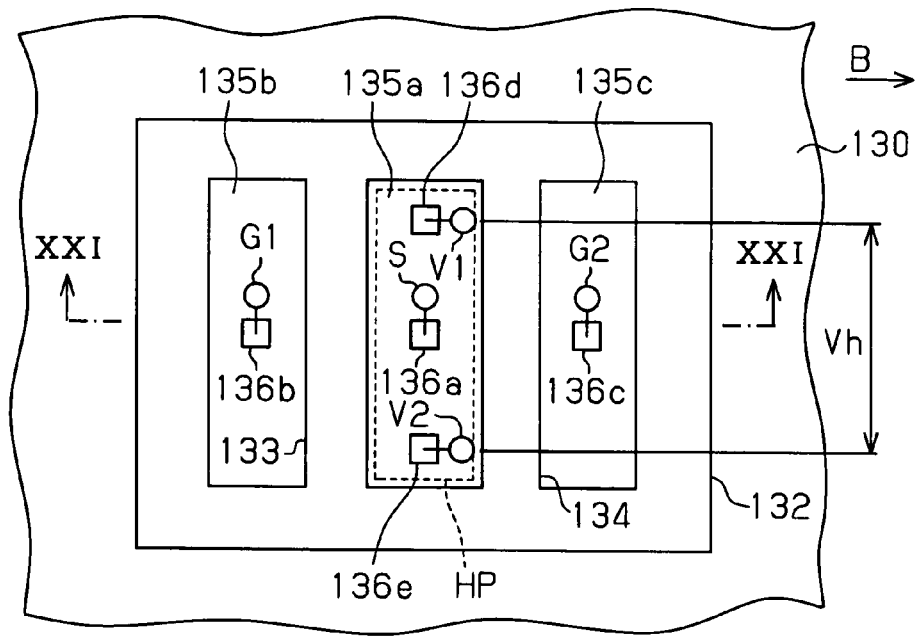
FIG. 20 is a plan view and typically shows the planar structure of the vertical Hall element able to be manufactured through a CMOS process.
Figure 21:
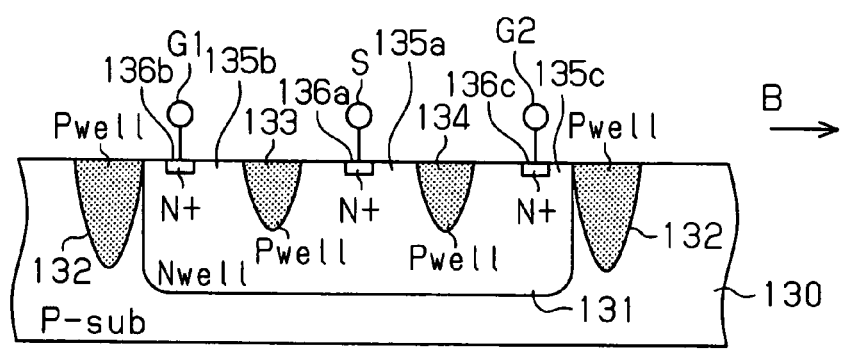
FIG. 21 is a cross-sectional view and typically shows the sectional structure of the vertical Hall element along XXI-XXI within FIG. 20.
Figure 22A:
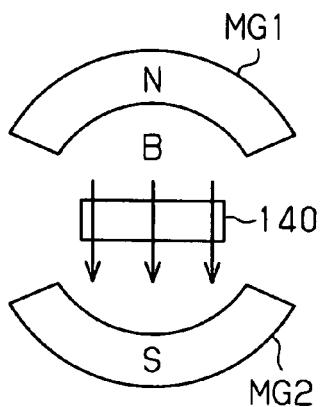
FIG. 22A is a typical view and typically shows an arranging mode of a magnet for generating a bias magnetic field and the Hall element.
Figure 22B:
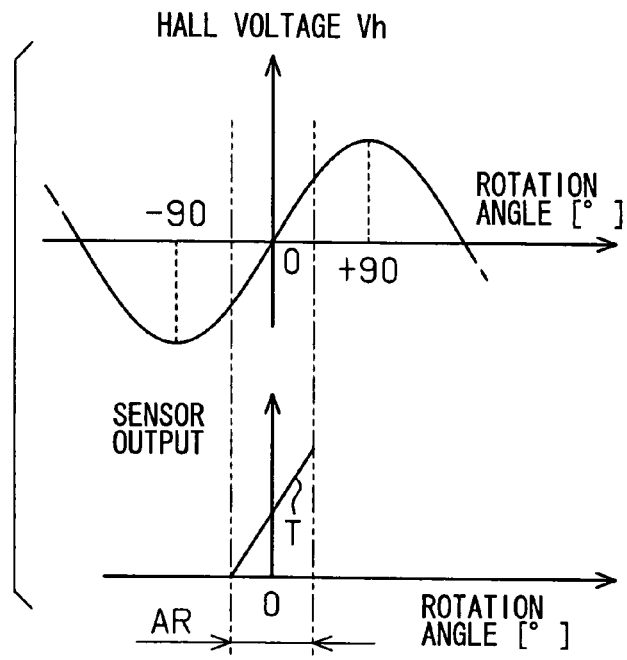
FIG. 22B is a graph and shows the relation of a rotation angle and a Hall voltage.
Figure 22C:
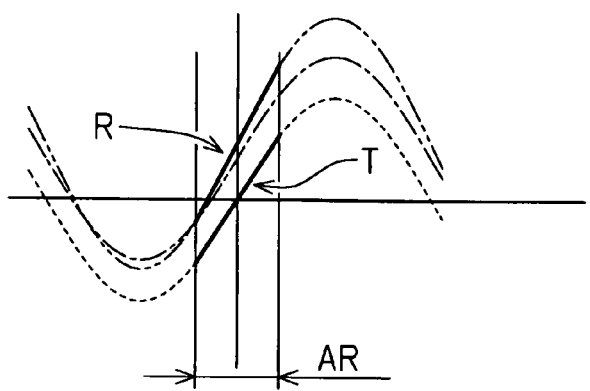
FIG. 22C is a graph and shows the relation of each of a theoretical Hall voltage, the same Hall voltage influenced by an offset voltage, and the same Hall voltage influenced by the offset voltage and a temperature characteristic, and the rotation angle.
Figure 23:
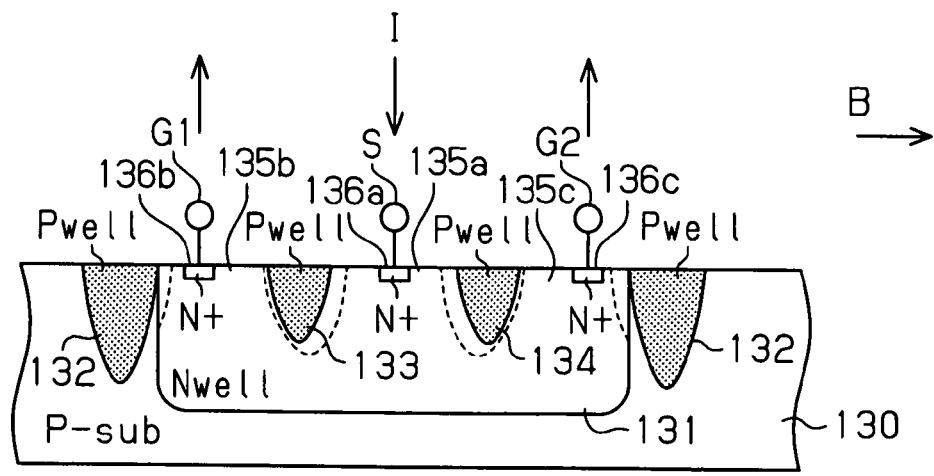
FIG. 23 is a cross-sectional view and shows a generating mode of a depletion layer in the vertical Hall element.
Figure 24:
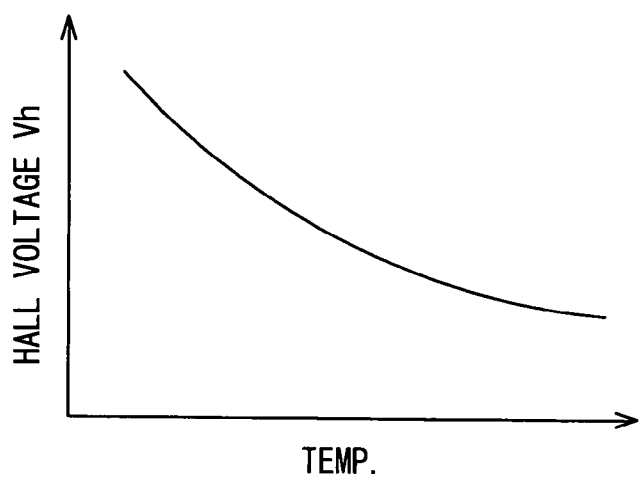
FIG. 24 is a graph and shows the relation of the Hall voltage and temperature of the vertical Hall element.

As shown in FIG. 1, the magnetic sensor in accordance with this embodiment mode is constructed by arranging a vertical Hall element (detection vertical Hall element) 10 for detecting a magnetic field emitted from a detection object, and a temperature monitor vertical Hall element (vertical Hall element for monitoring temperature) 20 having the same characteristics as this detection vertical Hall element 10. These detection vertical Hall element 10 and temperature monitor vertical Hall element 20 are formed in close positions of the same substrate. The arrangements of these detection vertical Hall element 10 and temperature monitor vertical Hall element 20 are arbitrary. However, when the width of a magnetic field (magnetic flux density B) shown in the previous FIG. 20 is narrow with respect to the direction of an arrow, it is desirable to arrange the detection vertical Hall element 10 and the temperature monitor vertical Hall element 20 in parallel with the left and right directions within FIG. 1 to raise sensitivity of the magnetic sensor. Further, when the width of the magnetic field (magnetic flux density B) is wide with respect to the direction of the arrow, the sensitivity of the magnetic sensor can be similarly raised if the detection vertical Hall element 10 and the temperature monitor vertical Hall element 20 are arranged in parallel with the vertical direction within FIG. 1. Further, if the detection vertical Hall element 10 and the temperature monitor vertical Hall element 20 are arranged at the chip center, an influence of chip stress received by the Hall elements is reduced. Therefore, accuracy of the magnetic sensor can be raised.

In such a magnetic sensor, a terminal S of the above detection vertical Hall element 10 is connected to a constant voltage driving source 11, and terminals G1, G2 are connected to the ground. On the other hand, a terminal S of the temperature monitor vertical Hall element 20 is connected to a constant electric current driving source 21, and terminals G1, G2 are connected to the ground.

Figure 2:
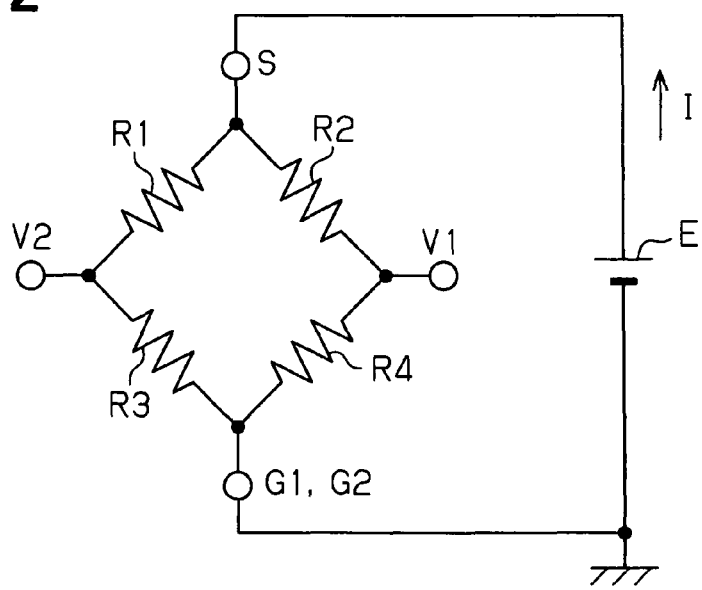
FIG. 2 is a circuit diagram and shows an equivalent circuit of a Hall element.

As shown in FIG. 2, the Hall element 10 for detecting a magnetic field is equivalently shown as a bridge circuit in which four resistors R1 to R4 are connected. These resistors R1 to R4 function as a magnetic resistance element, and are set such that changes of resistance values are respectively different in accordance with an applied magnetic field density. Further, resistors R1 and R4 and resistors R2 and R3 located in opposite positions are set such that the respective resistance values are changed in the same way in accordance with the direction of the applied magnetic field. For example, the resistance values of resistors R1, R4 are increased and the resistance values of resistors R2, R3 are decreased. Accordingly, when electric current I is supplied from electric power source E and terminal S, the voltages of terminals V1, V2 are changed by the resistance values of the respective resistors R1 to R4. Namely, an electric potential difference is generated between terminals V1, V2, and is outputted as the Hall voltage. The temperature monitor Hall element 20 is also similarly constructed.

Further, Hall voltage Vhd generated between terminals V1, V2 of the detection vertical Hall element 10 is inputted to an amplifier 12. On the other hand, a voltage taken out of a portion between terminal S and terminals G1, G2 of the temperature monitor vertical Hall element 20 as its interterminal voltage is inputted to an amplifier 22. Hall voltage Vd as a detection voltage constituting an output voltage of the above amplifier 12 and temperature monitor voltage Vm as an output voltage of the above amplifier 22 are respectively inputted to a subtractor circuit 30. Output voltage Vc outputted from an output terminal To of this subtractor circuit 30 becomes a sensor output of the magnetic sensor in this embodiment mode.

Figure 3A:
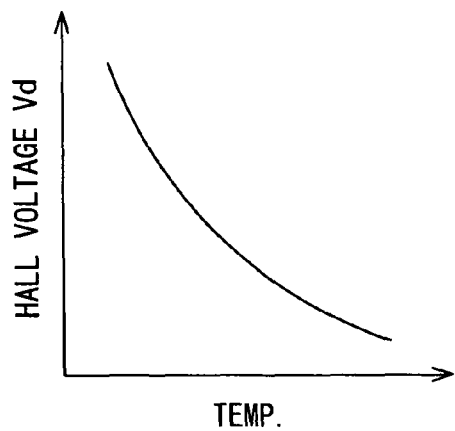
FIG. 3A is a graph and typically shows the relation of temperature and a Hall voltage in the magnetic sensor.
Figure 3B:
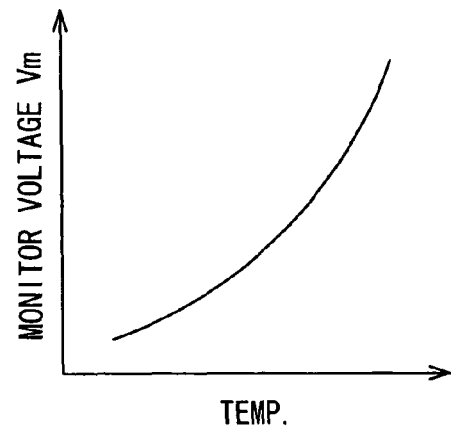
FIG. 3B is a graph and typically shows the relation of temperature and a temperature monitor voltage in the magnetic sensor.
Figure 4A:
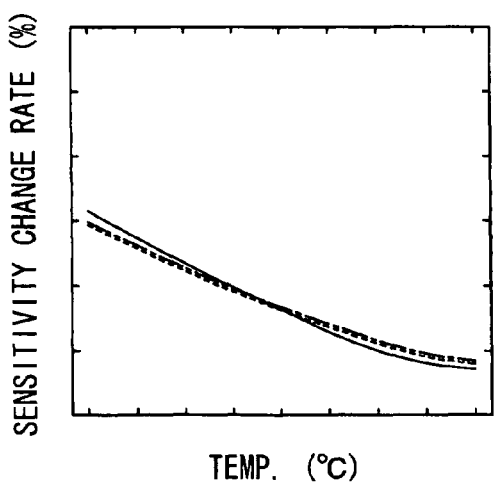
FIG. 4A is a graph and typically shows the relation of temperature and a sensitivity change rate.
Figure 4B:
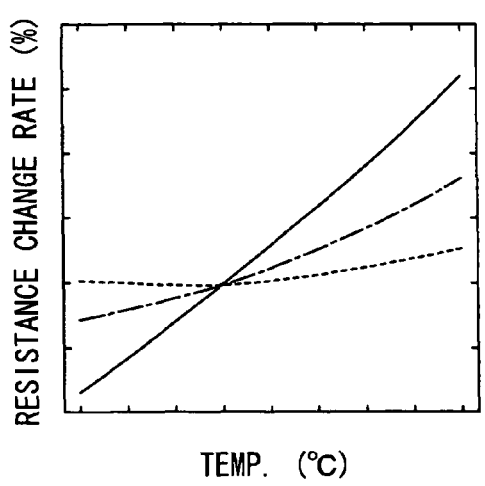
FIG. 4B is a graph and typically shows the relation of temperature and a resistance change rate.

In accordance with the magnetic sensor of such a construction, a temperature characteristic of the Hall voltage Vd and a temperature characteristic of the temperature monitor voltage Vm are canceled in the above subtractor circuit 30, and its sensor output (output voltage Vc) has a characteristic excellent in linearity with respect to a temperature change. Next, an arithmetic calculation for canceling the temperature characteristic of this Hall voltage Vd and the temperature characteristic of the temperature monitor voltage Vm will be explained in detail with reference to FIGS. 3A to 5. FIG. 3A typically shows the relation of temperature and the Hall voltage Vd as a graph. FIG. 3B typically shows the relation of temperature and the temperature monitor voltage Vm as a graph. FIG. 4A typically shows the relation of temperature and a sensitivity change rate. FIG. 4B typically shows the relation of temperature and a resistance change rate.

Figure 5:
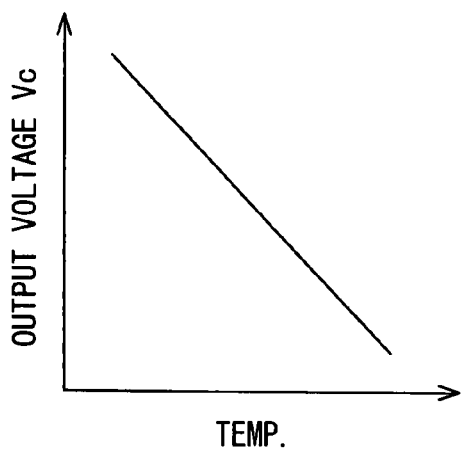
FIG. 5 is a graph and typically shows the relation of temperature and a sensor output in the magnetic sensor.

Further, FIG. 5 typically shows the relation of temperature and a sensor output (output voltage Vc) as a graph.

As mentioned above, the constant voltage driving source 11 is connected to the terminal S of the detection vertical Hall element 10, and both the terminals G1, G2 are connected to the ground. The detection vertical Hall element 10 is operated with a constant voltage such that its application voltage is constantly maintained. At this time, the Hall voltage Vhd of the detection vertical Hall element 10 is shown by the relation formula of:

$$Vhd = \mu h \times (W/L) \times V \times B,$$

when the width of this detection vertical Hall element 10 is W and its length is L and the magnetic flux density of the applied magnetic field is B and mobility is μh and the voltage applied by the constant voltage driving source 11 is V. In such a detection vertical Hall element 10, as temperature rises, a mean free path is shortened by an increase of thermal vibration of an atomic nucleus of an atom constituting this detection vertical Hall element 10 and scattering due to impurity ions. Therefore, the movement of an electron within a depletion layer is obstructed. Therefore, mobility μh of a carrier is reduced. Thus, in the detection vertical Hall element 10, as temperature rises, mobility μh is reduced. Its Hall voltage Vhd is exponentially reduced as temperature rises. Further, as carrier concentration is reduced, an increase degree of a depletion layer width caused by the rise in temperature is increased. Therefore, as shown in FIG. 3A, the Hall voltage Vd outputted from the amplifier 12 is similarly exponentially reduced as temperature rises.

On the other hand, in the temperature monitor vertical Hall element 20, a constant electric current driving source 21 is connected to its terminal S, and both terminals G1, G2 are connected to the ground. The temperature monitor vertical Hall element 20 is operated with a constant electric current such that its supply electric current is constantly maintained. At this time, Hall voltage Vhm of the temperature monitor vertical Hall element 20 is shown by the relation formula of:

$$Vhm = (Rh/d) \times I \times B,$$

when the thickness of this temperature monitor vertical Hall element 20 is d and the magnetic flux density of the applied magnetic field is B and a Hall coefficient is Rh and the electric current supplied by the constant electric current driving source 21 is I. In this relation formula, when an electric charge is q and a carrier density is n, the Hall coefficient Rh is a value shown by the relation formula of $Rh = 1/(q \times n)$. In such a temperature monitor vertical Hall element 20, when temperature rises, a carrier number excited from its impurity level is increased so that the carrier density n is increased. Therefore, the Hall coefficient Rh is reduced through such an increase of the carrier density n. Its Hall voltage Vhm is exponentially reduced as temperature rises. Further, since the mobility of the carrier is reduced as temperature rises, an electric resistance value of the temperature monitor vertical Hall element 20 is increased as temperature rises. Thus, the inter-terminal voltage between the terminal S and the terminals G1, G2 of the temperature monitor vertical Hall element 20 is exponentially increased as temperature rises. Thus, as shown in FIG. 3B, temperature monitor voltage Vm outputted from the amplifier 22 is also exponentially increased as temperature rises.

A further detailed explanation will be made. A temperature change of the Hall voltage Vhm in the Hall element 10 for detecting a magnetic field is provided as shown in FIG. 4A. This change is shown by the relation formulas of:

$$S(T) = S(O)(1 + \beta_1 T + \beta_2 T^2),$$

$$\beta_t = B_{t0} + B_{t1} \log Ns + B_{t2} \log Ns^2 + B_{t3} \log Ns^3, \text{ and}$$

(T=1,2), with respect to temperature T. Namely, this change can be represented by the coefficient β depending on the carrier concentration Ns. On the other hand, a temperature change of resistance of the temperature monitor Hall element 20 is provided as shown in FIG. 4B. The change of this resistance value R is shown by the relation formulas of:

$$R(T) = R(O)(1 + \alpha_1 T + \alpha_2 T^2),$$

$$\alpha_t = A_{t0} + A_{t1} \log Ns + A_{t2} \log Ns^2 + A_{t3} \log Ns^3, \text{ and}$$

(T=1,2), with respect to temperature T. Namely, this change can be represented by the coefficient α depending on the carrier concentration Ns. Accordingly, the change of the Hall voltage with respect to the temperature change can be canceled by conforming the coefficients A, B such that the above coefficients α and β are equal. The coefficients are multiplied when an arithmetic calculation is made in the above subtractor circuit 30.

Thus, the Hall voltage Vd has a negative temperature coefficient, and the temperature monitor voltage Vm has a positive temperature coefficient. The temperature coefficients of the Hall voltage Vd and the temperature monitor voltage Vm are reverse. Accordingly, as shown in FIG. 5, the output voltage Vc of the subtractor circuit 30 inputting these Hall voltage Vd and temperature monitor voltage Vm has a characteristic excellent in linearity with respect to the temperature change. Therefore, on the basis of the output voltage Vc outputted from such a subtractor circuit 30, the change of the Hall voltage Vhd caused by the temperature characteristic can be corrected with high accuracy. Here, output voltage Vc=Hall voltage Vd−temperature monitor voltage Vm.

In this embodiment mode, the detection vertical Hall element 10 is constructed so as to correspond to "a detection Hall element", and the temperature monitor vertical Hall element 20 is constructed so as to correspond to "a temperature monitor Hall element". Further, in this embodiment mode, the terminal S and the terminals G1, G2 are constructed so as to correspond to "driving signal supply terminals".

As explained above, the following effects can be obtained in accordance with the magnetic sensor in this embodiment mode.

The temperature monitor vertical Hall element 20 having the same characteristic as the detection vertical Hall element 10 is arranged near this detection vertical Hall element 10. The temperature monitor voltage Vm outputted from the amplifier 22 in accordance with the voltage taken out of a portion between the terminal S and the terminals G1, G2 of the temperature monitor vertical Hall element 20 as its inter-terminal voltage is subtracted in the subtractor circuit 30 from the Hall voltage Vd outputted from the amplifier 12 in accordance with the Hall voltage Vhd of the detection vertical Hall element 10. Thus, the output voltage Vc outputted from the subtractor circuit 30 has a characteristic excellent in linearity with respect to the temperature change. Accordingly, the change of the Hall voltage Vhd caused by the temperature characteristic can be corrected on the basis of high accuracy. In this connection, if the detection vertical Hall element 10 and the temperature monitor vertical Hall element 20 are arranged at the chip center, the influence of chip stress received by the Hall elements is reduced. Therefore, accuracy of the magnetic sensor can be raised.

Since the output voltage Vc outputted from the subtractor circuit 30 has a characteristic excellent in linearity, an interpolation correction is easy and the change of the Hall voltage Vhd caused by the temperature characteristic can be corrected on the basis of high accuracy. For example, if the output voltage Vc at two temperatures is selected and is approximated on a straight line between these two points, the change of the Hall voltage Vhd caused by the temperature characteristic can be corrected for a very short time in low arithmetic load. In this connection, in accordance with such a correcting mode, sufficient accuracy can be secured even when no curve correction using a secondary function is made. Therefore, a circuit required in the curve correction can be omitted and a circuit scale can be also reduced.

The vertical Hall element such as the detection vertical Hall element 10 and the temperature monitor vertical Hall element 20 is adopted as a sensor for detecting magnetism. In the vertical Hall element, an element forming area on the chip is generally small in comparison with the lateral Hall element. Therefore, the detection vertical Hall element 10 and the temperature monitor vertical Hall element 20 can be arranged more closely by adopting the vertical Hall element in this way. In its turn, the change of the Hall voltage caused by the temperature characteristic can be corrected on the basis of higher accuracy.

The temperature monitor vertical Hall element 20 having the same characteristic as the detection vertical Hall element 10 is arranged near this detection vertical Hall element 10. The temperature monitor voltage Vm outputted from the amplifier 22 in accordance with the voltage taken out of a portion between the terminal S and the terminals G1, G2 of the temperature monitor vertical Hall element 20 as its inter-terminal voltage is subtracted in the subtractor circuit 30 from the Hall voltage Vd outputted from the amplifier 12 in accordance with the Hall voltage Vhd of the detection vertical Hall element 10. When the output voltage of the detection Hall element 10 is a voltage offset by the factor described in the prior art, the output voltage of the temperature monitor Hall element 20 similarly becomes an offset voltage. Accordingly, an offset amount is also subtracted by subtracting the temperature monitor voltage Vm from the Hall voltage Vd as the offset voltage. The offset voltage can be canceled, i.e., the output voltage can be corrected.

Second Embodiment Mode

Next, a second embodiment mode for embodying the magnetic sensor in the present invention will be explained. The magnetic sensor in accordance with this embodiment mode also has a construction similar to that of the magnetic sensor in accordance with the previous first embodiment mode.

Figure 6:
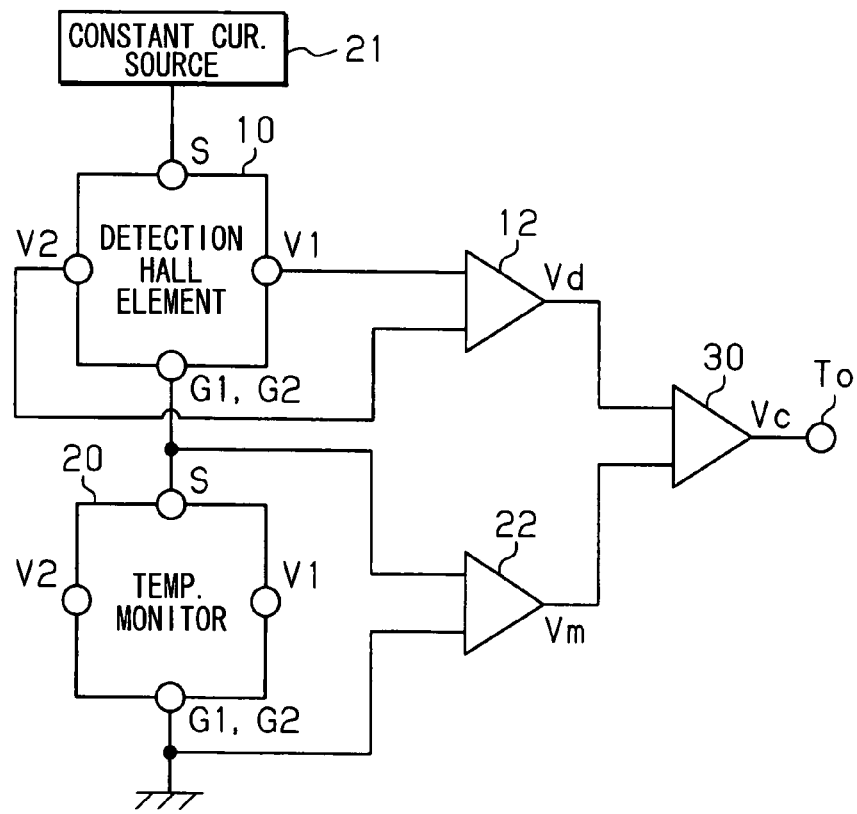
FIG. 6 is a circuit diagram and shows a circuit construction as its main with respect to a second embodiment mode of the magnetic sensor.

As shown in FIG. 6, in the magnetic sensor in accordance with this embodiment mode, the terminal S of the detection vertical Hall element 10 is connected to the constant electric current driving source 21, and terminals G1, G2 are connected to the terminal S of the temperature monitor vertical Hall element 20. Both the terminals G1, G2 of the temperature monitor vertical Hall element 20 are connected to the ground. Thus, in the magnetic sensor in accordance with this embodiment mode, the previous detection vertical Hall element 10 and the previous temperature monitor vertical Hall element 20 are connected in series to the constant electric current driving source 21. Both the detection vertical Hall element 10 and the temperature monitor vertical Hall element 20 are operated with a constant electric current.

In the magnetic sensor in accordance with this embodiment mode, similar to the magnetic sensor in the previous first embodiment mode, the Hall voltage Vhd generated between terminals V1, V2 of the detection vertical Hall element 10 is also inputted to the amplifier 12. Further, a voltage taken out of a portion between the terminal S and the terminals G1, G2 of the temperature monitor vertical Hall element 20 as its inter-terminal voltage is inputted to the amplifier 22. Further, the Hall voltage Vd as an output voltage of the above amplifier 12 and the temperature monitor voltage Vm as an output voltage of the above amplifier 22 are respectively inputted to the subtractor circuit 30.

In the magnetic sensor of such a construction, the Hall coefficient Rh is also reduced in the detection vertical Hall element 10 as temperature rises. Therefore, its Hall voltage Vhd is exponentially reduced as temperature rises. Further, in the temperature monitor vertical Hall element 20, as temperature rises, the mobility of the carrier is reduced and its electric resistance value is raised. Thus, the inter-terminal voltage between the terminal S and the terminals G1, G2 of the temperature monitor vertical Hall element 20 exponentially rises as temperature rises. Accordingly, the output voltage Vc of the subtractor circuit 30 inputting these Hall voltage Vd and temperature monitor voltage Vm has a characteristic excellent in linearity with respect to the temperature change. Therefore, the change of the Hall voltage Vhd caused by the temperature characteristic can be also corrected with high accuracy on the basis of the output voltage Vc outputted from the above subtractor circuit 30 by the magnetic sensor in accordance with this embodiment mode.

Figure 7:
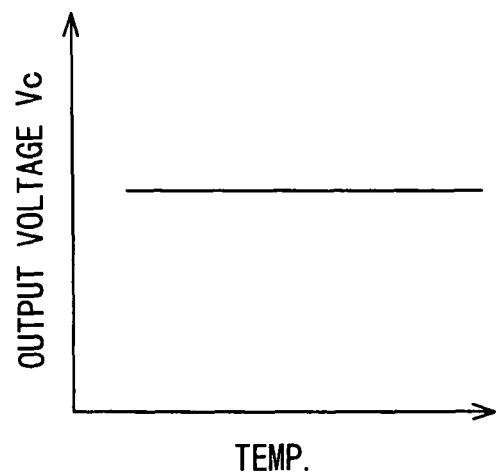
FIG. 7 is a graph and typically shows the relation of temperature and the Hall voltage in the magnetic sensor.

When the vertical Hall element is operated with a constant voltage and is operated with a constant electric current, it is known that temperature dependence in the operating case of the constant electric current becomes small in comparison with the operating case of the constant voltage. In this embodiment mode, as mentioned above, both the detection vertical Hall element 10 and the temperature monitor vertical Hall element 20 are operated with a constant electric current. Therefore, in accordance with the magnetic sensor in this embodiment mode, as shown in FIG. 7, the output voltage Vc small in temperature dependence, i.e., small in a temperature coefficient is outputted from the magnetic sensor.

As explained above, in accordance with the magnetic sensor in this embodiment mode, the following effects can be obtained.

The detection vertical Hall element 10 and the temperature monitor vertical Hall element 20 are connected in series to the constant electric current driving source 21. Both these detection vertical Hall element 10 and temperature monitor vertical Hall element 20 are operated with a constant electric current. Thus, the same electric current as the electric current flowed to the detection vertical Hall element 10 is also flowed to the temperature monitor vertical Hall element 20. Therefore, the output voltage Vc small in dependence of the Hall voltage Vhd with respect to temperature, i.e., in a temperature coefficient is outputted from the magnetic sensor. Thus, the change of Hall voltage Vhd caused by the temperature characteristic can be corrected with higher accuracy.

Further, since both the detection vertical Hall element 10 and the temperature monitor vertical Hall element 20 are operated with a constant electric current in this way, it is not necessary to prepare two driving sources (driving circuits) and an occupying area of the magnetic sensor in a chip can be also reduced.

Third Embodiment Mode

Figure 8:
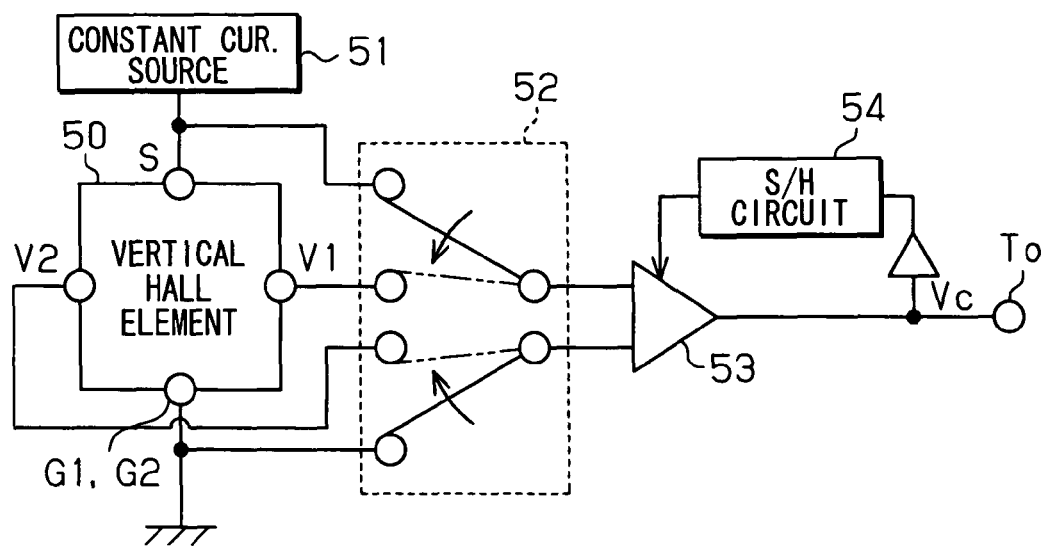
FIG. 8 is a circuit diagram and shows a circuit construction as its main with respect to a third embodiment mode of the magnetic sensor.

A third embodiment mode for embodying the magnetic sensor in the present invention will next be explained. In the magnetic sensor in accordance with this embodiment mode, a function born in each of the previous detection vertical Hall element and the previous temperature monitor vertical Hall element is realized by a single Hall element. Such a magnetic sensor will be explained with reference to FIG. 8. FIG. 8 typically shows a circuit construction of the magnetic sensor in accordance with this embodiment mode.

As shown in FIG. 8, terminal S of a vertical Hall element 50 is connected to a constant electric current driving source 51, and terminals G1, G2 are connected to the ground. Further, these terminals S, G1, G2 and terminals V1, V2 of the vertical Hall element 50 are respectively connected to a switch circuit 52. Two input terminals of an adder circuit 53 are connected to this switch circuit 52.

This switch circuit 52 is constructed by arranging four fixing contacts and two movable contacts. The terminal S, terminals G1, G2 and terminals V1, V2 of the above vertical Hall element 50 are respectively connected to the fixing contacts of the switch circuit 52, and the input terminals of the above adder circuit 53 are respectively connected to the movable contacts. This switch circuit 52 is constructed such that, when one movable contact is connected to the terminal S, the other movable contact is connected to the terminals G1, G2. The switch circuit 52 is also constructed such that, when one movable contact is connected to the terminal V1, the other movable contact is connected to the terminal V2. Namely, the switch circuit 52 is operated such that the Hall voltage Vh outputted from the vertical Hall element 50 and the temperature monitor voltage taken out as the inter-terminal voltage between the terminal S and the terminals G1, G2 are switched and outputted to the adder circuit 53 by switching the movable contacts between the fixing contacts. For example, an analog switch is adopted as such a switch circuit 52.

Further, in this magnetic sensor, a sampling hold circuit (S/H circuit) 54 is connected to the above adder circuit 53. This sampling hold circuit 54 is constructed such that the output voltage Vc of the adder circuit 53 is held in timing in which the movable contact of the above switch circuit 52 is switched on the side of the terminal S and the terminals G1, G2. The adder circuit 53 adds the voltage switched and outputted from the switch circuit 52 and the voltage inputted from the sampling hold circuit 54, and outputs the added voltage as the output voltage Vc.

In the magnetic sensor having such a construction, when the temperature monitor voltage is switched and outputted by the switch circuit 52, this temperature monitor voltage is held in the sampling hold circuit 54. Subsequently, when the Hall voltage Vh is switched and outputted by the switch circuit 52, this Hall voltage Vh and the temperature monitor voltage held in the above sampling hold circuit 54 are added in the adder circuit 53. As its result, the output voltage Vc of the magnetic sensor has a characteristic excellent in linearity with respect to the temperature change. Accordingly, the change of the Hall voltage Vh caused by the temperature characteristic can be also corrected with high accuracy by the magnetic sensor of such a construction.

In this embodiment mode, the switch circuit 52 is constructed so as to correspond to "a switching means".

As explained above, in accordance with the magnetic sensor in this embodiment mode, the following effects can be obtained.

The Hall voltage Vh outputted from the vertical Hall element 50 and the temperature monitor voltage taken out as the inter-terminal voltage of this vertical Hall element 50 are switched and outputted by the switch circuit 52. Further, the above temperature monitor voltage is held in the sampling hold circuit 54, and this temperature monitor voltage and the above Hall voltage Vh are added in the adder circuit 53. Thus, the output voltage Vc having a characteristic excellent in linearity with respect to the temperature change is outputted from the adder circuit 53. Further, an arithmetic calculation for canceling the temperature characteristics of the Hall voltage Vh and the temperature monitor voltage in the same vertical Hall element 50 is made by these voltages. Therefore, the output voltage Vc has a characteristic more excellent in linearity with respect to the temperature change. Therefore, the change of the Hall voltage Vh caused by the temperature characteristic can be corrected on the basis of higher accuracy.

The magnetic sensors in these embodiments are not limited to each of the above embodiment modes, but can be also executed as e.g., the following modes in which these embodiment modes are suitably changed.

Figure 9:
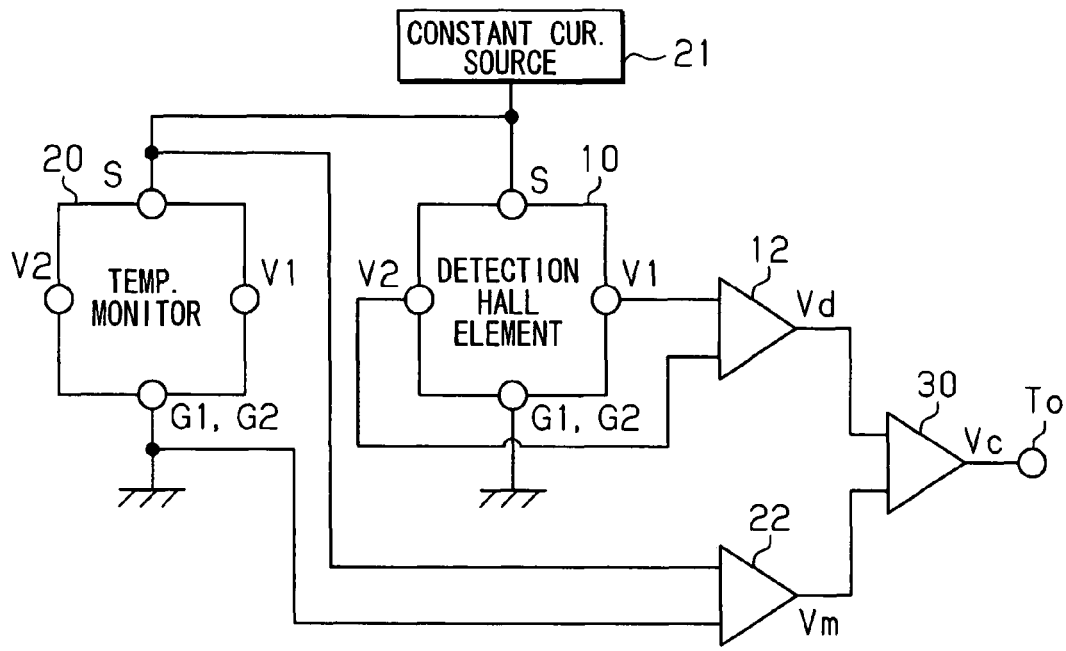
FIG. 9 is a circuit diagram and shows a circuit construction as its main with respect to another embodiment mode of the magnetic sensor.

In the above first embodiment mode, the constant voltage driving source 11 is connected to the terminal S of the detection vertical Hall element 10, and the terminals G1, G2 are connected to the ground. Thus, this detection vertical Hall element 10 is operated with a constant voltage. A driving method of this detection vertical Hall element 10 is not limited to such constant voltage driving. For example, as shown in FIG. 9, the above terminal S may be connected to a constant electric current driving source 21, and both this detection vertical Hall element 10 and the temperature monitor vertical Hall element 20 may be also operated with a constant electric current. Thus, if the detection vertical Hall element 10 and the temperature monitor vertical Hall element 20 are connected in parallel to the constant electric current driving source 21, a synthetic resistance of a parallel circuit constructed by these detection vertical Hall element 10 and temperature monitor vertical Hall element 20 can be reduced. Therefore, the amount of an electric current supplied in the constant electric current driving source 21 can be increased. Therefore, if the supply electric current amount of the constant electric current driving source 21 is increased and Hall voltages Vhd, Vhm outputted from the detection vertical Hall element 10 and the temperature monitor vertical Hall element 20 are increased, amplification factors of the amplifiers 12, 22 can be reduced and the magnetic field emitted from a detection object can be detected with high accuracy.

Figure 10:
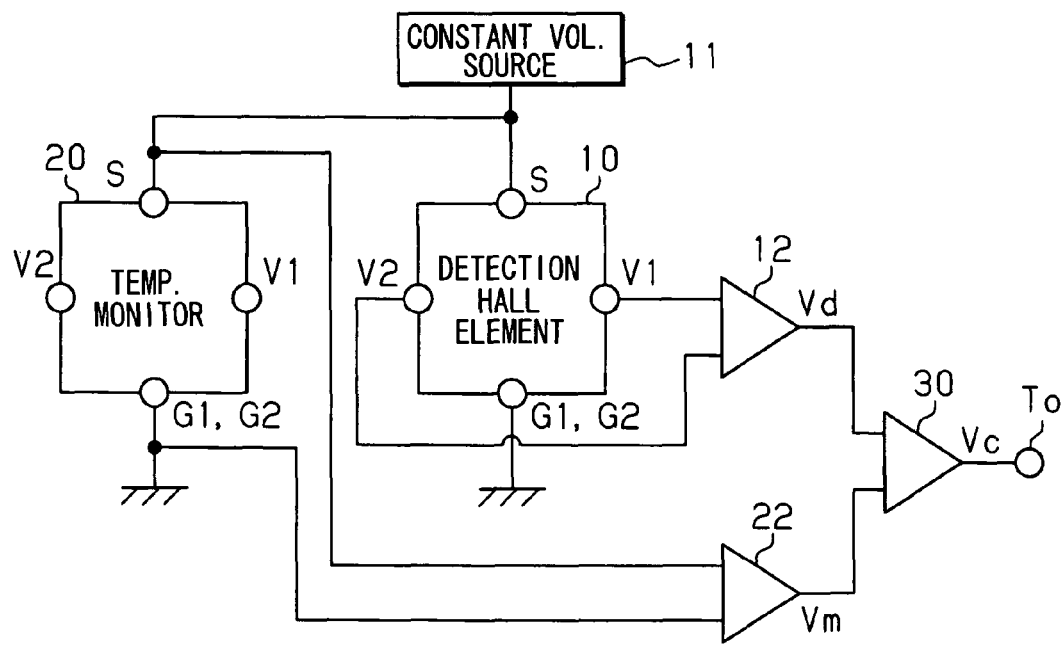
FIG. 10 is a circuit diagram and shows a circuit construction as its main with respect to another embodiment mode of the magnetic sensor.

Further, in the above first embodiment mode, the constant electric current driving source 21 is connected to the terminal S of the temperature monitor vertical Hall element 20 and the terminals G1, G2 are connected to the ground. Thus, this temperature monitor vertical Hall element 20 is operated with a constant electric current. A driving method of this temperature monitor vertical Hall element 20 is not limited to such constant electric current driving. For example, as shown in FIG. 10, the above terminal S may be connected to the constant voltage driving source 11, and both this temperature monitor vertical Hall element 20 and the detection vertical Hall element 10 may be also operated with a constant voltage.

Figure 11:
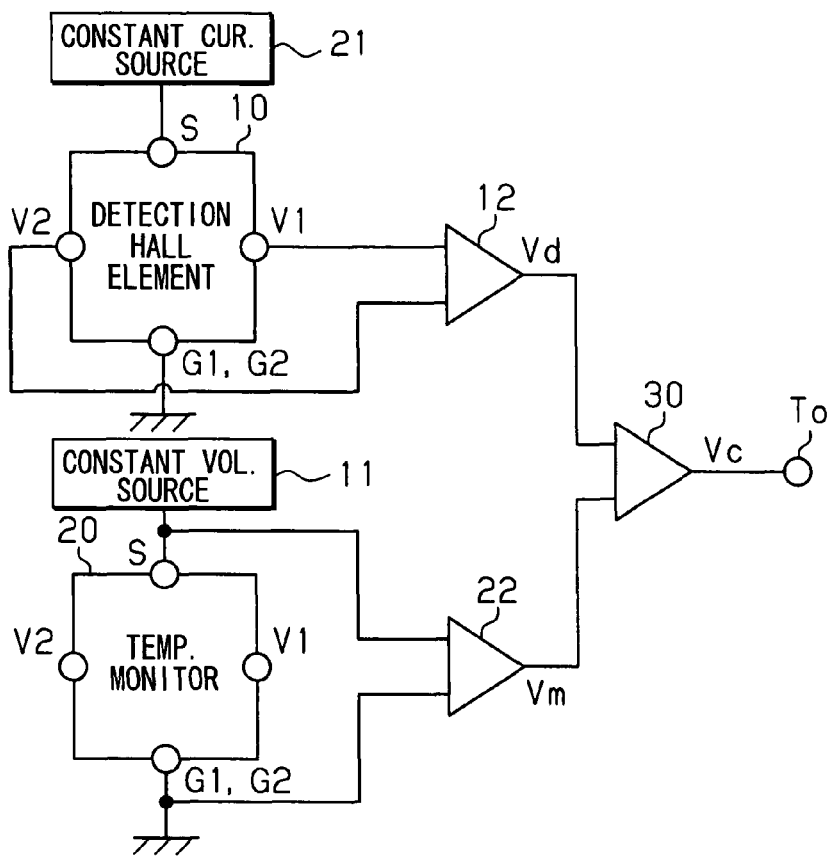
FIG. 11 is a circuit diagram and shows a circuit construction as its main with respect to another embodiment mode of the magnetic sensor.

Further, as shown in FIG. 11, the terminal S of the detection vertical Hall element 10 may be connected to the constant electric current driving source 21, and this detection vertical Hall element 10 may be operated with a constant electric current, and the terminal S of the temperature monitor vertical Hall element 20 may be connected to the constant voltage driving source 11, and this temperature monitor vertical Hall element 20 may be also operated with a constant voltage.

Figure 12:
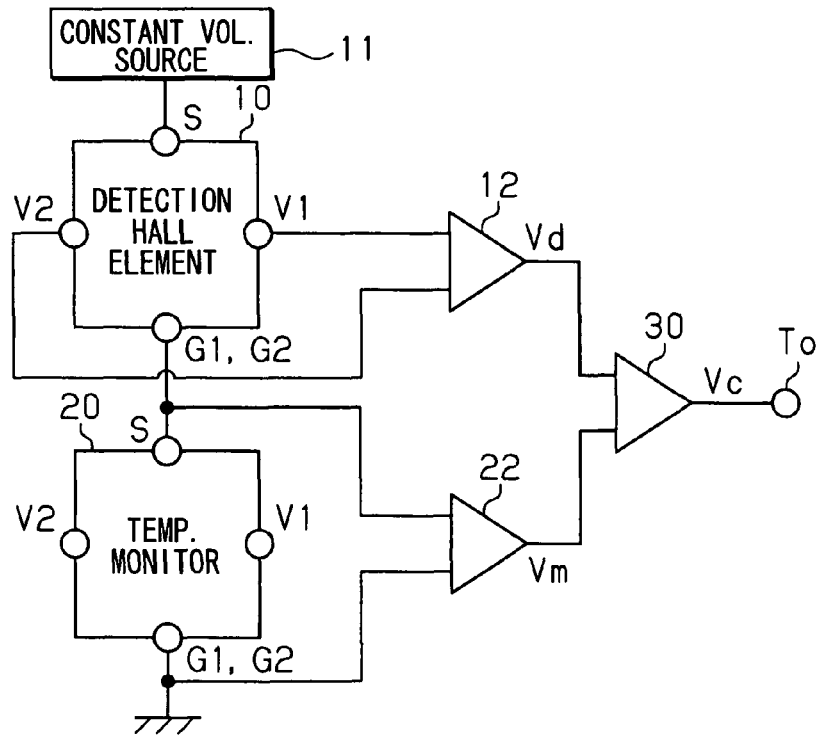
FIG. 12 is a circuit diagram and shows a circuit construction as its main with respect to another embodiment mode of the magnetic sensor.

In the above second embodiment mode, the detection vertical Hall element 10 and the temperature monitor vertical Hall element 20 are connected in series to the constant electric current driving source 21. Thus, both these detection vertical Hall element 10 and temperature monitor vertical Hall element 20 are operated with a constant electric current. However, the driving method of a series circuit constructed by this detection vertical Hall element 10 and the temperature monitor vertical Hall element 20 is not limited to the above constant electric current driving. Namely, as shown in FIG. 12, both the detection vertical Hall element 10 and the temperature monitor vertical Hall element 20 may be also operated with a constant voltage by connecting the constant voltage driving source 11 to the terminal S of the detection vertical Hall element 10.

In the magnetic sensors in accordance with the above first and second embodiment modes, a subtracting arithmetic calculation for subtracting the temperature monitor voltage Vm from the Hall voltage Vd is made in the subtractor circuit 30 to cancel the temperature characteristic of the Hall voltage Vd outputted from the detection vertical Hall element 10 and the temperature characteristic of the temperature monitor voltage Vm taken out as the inter-terminal voltage of the temperature monitor vertical Hall element 20. The arithmetic calculation for canceling the temperature characteristic of the Hall voltage Vd and the temperature characteristic of the temperature monitor voltage Vm in this way is not limited to the above subtracting arithmetic calculation. For example, an adder circuit may be arranged instead of the subtractor circuit 30, and an adding arithmetic calculation for adding the above temperature monitor voltage Vm to the above Hall voltage Vd may be also made. The output voltage Vc having a characteristic excellent in linearity with respect to the temperature change is also obtained by the magnetic sensor having such a construction.

Figure 13:
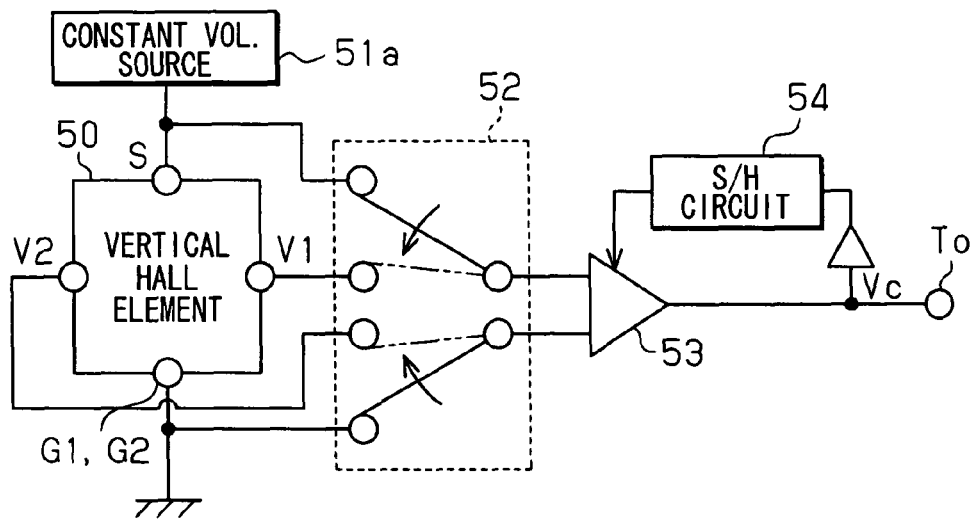
FIG. 13 is a circuit diagram and shows a circuit construction as its main with respect to another embodiment mode of the magnetic sensor.

In the magnetic sensor in accordance with the above third embodiment mode, the constant electric current driving source 51 is connected to the terminal S of the vertical Hall element 50, and the terminals G1, G2 are connected to the ground. Thus, this vertical Hall element 50 is operated with a constant electric current. The driving method of the vertical Hall element 50 is not limited to this constant electric current driving. As shown in FIG. 13, this vertical Hall element 50 may be also operated with a constant voltage by connecting a constant voltage driving source 51a to the terminal S of the vertical Hall element 50.

Figure 14A:
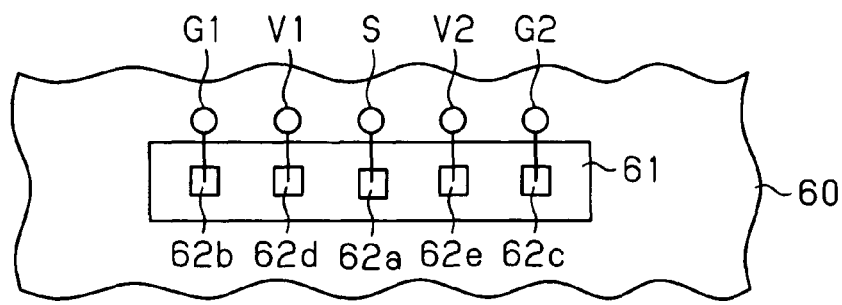
FIG. 14A is a plan view and shows a vertical Hall element.
Figure 14B:
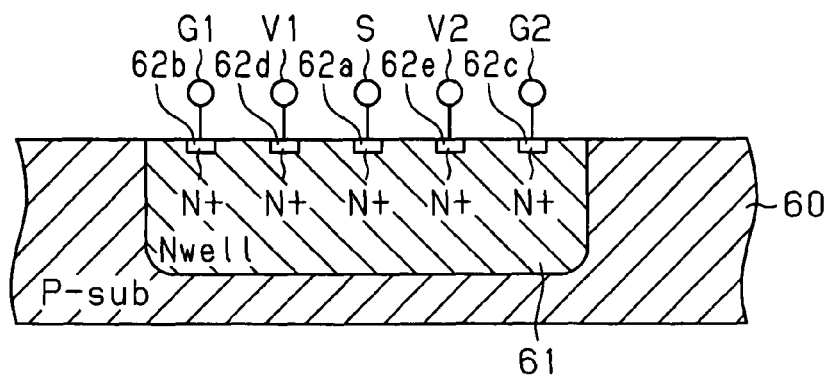
FIG. 14B is a cross-sectional view and shows the vertical Hall element.

The structure of the vertical Hall element in each of the above embodiment modes may be also suitably changed. For example, the Hall element of a structure shown in FIGS. 14A and 14B may be also used. As shown in FIG. 14B, this vertical Hall element is constructed by arranging a semiconductor support layer (P-sub) 60 constructed by silicon of P-type, and a semiconductor area (Nwell) 61 of N-type formed as a diffusion layer (well) by introducing electric conductivity type impurities of N-type onto the surface of the semiconductor support layer 60. As shown in FIG. 14A, five diffusion layers 62a to 62e of N-type (N+) are formed on a straight line on the surface of the semiconductor area 61. The diffusion layers 62a to 62e function as a contact area, and are respectively electrically connected to terminal S, terminal G1, terminal G2, terminal V1 and terminal V2. In the vertical Hall element having such a structure, a magnetic field component parallel to the surface of the above semiconductor area 61 can be also detected by flowing a constant driving electric current from terminal S to terminal G1 and a constant driving electric current from terminal S to terminal G2.

In the above embodiment mode, the temperature characteristics are canceled by using the temperature monitor Hall element having the same characteristic as the detection Hall element and arranged near this detection Hall element. As described in the first embodiment mode, the temperature characteristics can be canceled by conforming coefficients. Accordingly, it is not necessary for the temperature monitor Hall element (second detection device) to have the same characteristic as the detection Hall element (first detection device). Namely, it is apparent that the sizes and kinds of the detection Hall element and the temperature monitor Hall element may be differently set. Accordingly, it is not necessary to perform fine process control such that the electric characteristics of the temperature monitor Hall element and the detection Hall element are set to the same. Therefore, the sensor is easily manufactured. Further, the Hall element is equivalent to a bridge circuit constructed by four resistors. Accordingly, it is apparent that a resistor may be also used and executed in the temperature monitor.

Figure 15A:
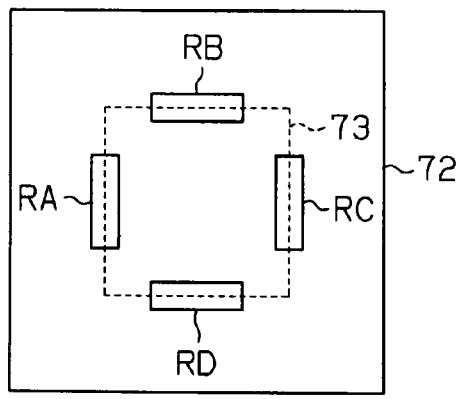
FIG. 15A is a plan view and shows a pressure sensor.
Figure 15B:
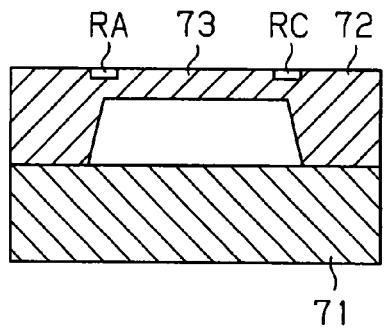
FIG. 15B is a cross-sectional view and shows the pressure sensor.
Figure 16:
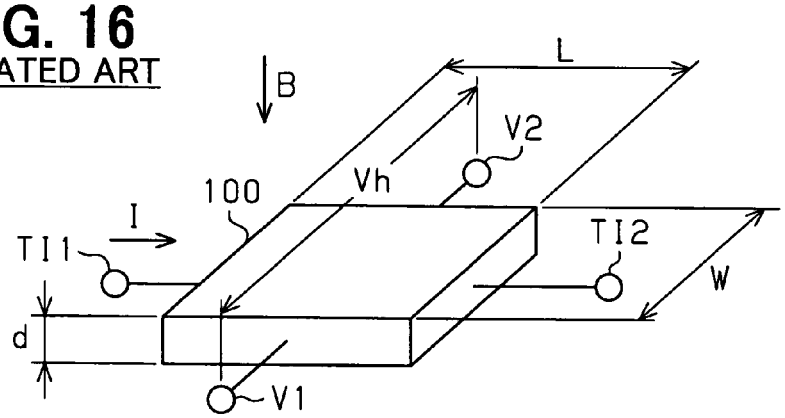
FIG. 16 is a perspective view and explains a magnetism detection principle of a general Hall element.
Figure 17A:
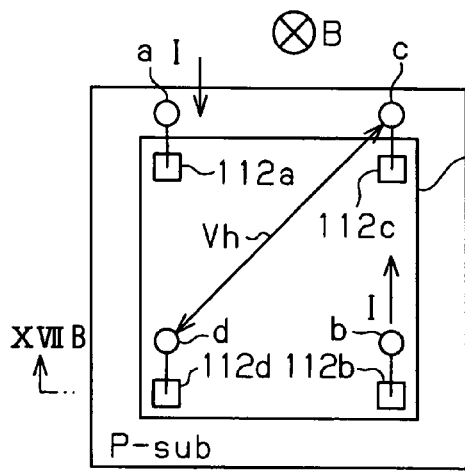
FIG. 17A is a plan view and typically shows the planar structure of a lateral Hall element.
Figure 17B:
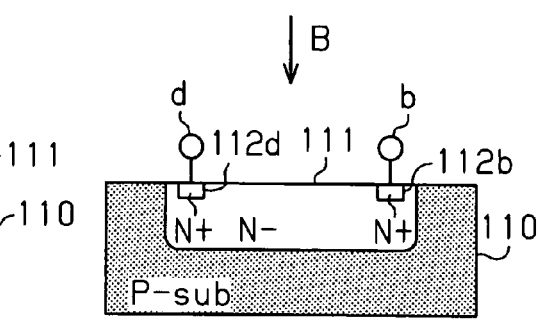
FIG. 17B is a cross-sectional view and typically shows a sectional structure of the lateral Hall element along XVIIB-XVIIB of FIG. 17A.
Figure 18:
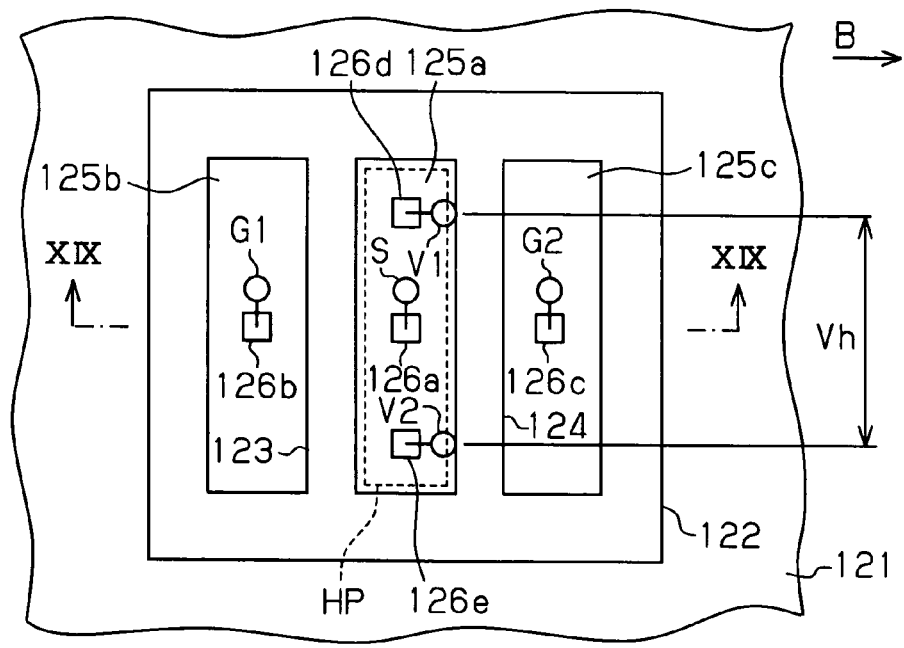
FIG. 18 is a plan view and typically shows the planar structure of the vertical Hall element.
Figure 19:
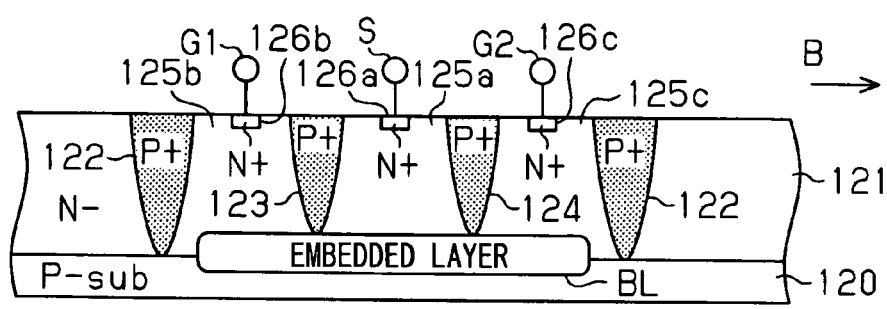
FIG. 19 is a cross-sectional view and typically shows the sectional structure of the vertical Hall element along XIX-XIX within FIG. 18.

In the sensor for detecting the magnetic field by using the Hall element equivalently represented as a bride circuit in the above embodiment mode, its temperature characteristics are set to be canceled. This may be also applied to another sensor. For example, there is a pressure sensor as an example for forming the detection element as a bridge circuit. As shown in FIG. 15B, this pressure sensor is constructed by arranging a silicon substrate 72 adhered and fixed on a pedestal 71 constructed by glass, etc. A diaphragm 73 thinly made as a sensing portion is formed in the silicon substrate 72 as a semiconductor substrate. As shown in FIG. 15A, diffusion resistors (strain gauges) RA, RB, RC, RD are formed in a forming area of the diaphragm 73 and constitute a bridge circuit. In FIG. 15A, the diffusion resistors RA, RB, RC, RD are formed along the circumference of the diaphragm 73, but its arrangement may be suitably changed. For example, two strain gauges may be formed in an end portion of the diaphragm 73 and two strain gauges may be also formed in a surface central portion of the diaphragm 73.

With respect to the pressure sensor constructed as mentioned above, a temperature monitor element (a pressure sensor, a resistance element, etc. similarly constructed) may be arranged in the vicinity, and an arithmetic calculation for canceling the temperature characteristic of the output voltage of the pressure sensor by an output voltage of this temperature monitor element may be also made. Further, the temperature characteristic of the output voltage of the pressure sensor may be also canceled by using the inter-terminal voltage of the pressure sensor as a temperature monitor voltage.

In each of the above embodiment modes, the so-called vertical Hall element is adopted as a magnetism-electricity converting element, but a former lateral Hall element may be also adopted as the magnetism electricity converting element.

The above disclosure includes the following modes.

In accordance with a first mode of the present disclosure, a semiconductor device is constructed by a detection Hall element for detecting a magnetic field emitted from a detection object, a temperature monitor Hall element, and a calculation circuit. The detection Hall element approximately has the same characteristic as the temperature monitor Hall element. The detection Hall element is arranged near the temperature monitor Hall element. The detection Hall element outputs a Hall voltage. The temperature monitor Hall element has a pair of driving signal supply terminals for outputting a temperature monitor voltage. The calculation circuit makes an arithmetic calculation for canceling the temperature characteristic of the Hall voltage on the basis of the Hall voltage and the temperature monitor voltage.

With respect to the temperature monitor voltage taken out as the above inter-terminal voltage, its temperature coefficient with respect to temperature is normally reverse in comparison with the above Hall voltage. Accordingly, an arithmetic calculation for canceling the temperature characteristic as mentioned above can be made between these Hall voltage and temperature monitor voltage. The above sensor output obtained through such an arithmetic calculation also becomes a voltage having a characteristic naturally excellent in linearity with respect to the temperature change. Therefore, when an interpolation correction, etc. based on temperature with respect to the above sensor output is made, its accuracy is suitably maintained. Accordingly, the change of the Hall voltage caused by the temperature characteristic can be corrected on the basis of high accuracy.

As a replaced idea, the calculation circuit may be also an adder circuit for adding the temperature monitor voltage to the Hall voltage. Otherwise, the calculation circuit may be also a subtractor circuit for subtracting the temperature monitor voltage from the Hall voltage. In these cases, a sensor output having a characteristic excellent in linearity with respect to the temperature change can be obtained.

As a replaced idea, the detection Hall element may be operated with a constant voltage, and the temperature monitor Hall element may be operated with a constant electric current. Otherwise, the detection Hall element may be operated with a constant electric current and the temperature monitor Hall element may be operated with a constant voltage. Otherwise, both the detection Hall element and the temperature monitor Hall element may be also operated with a constant electric current. Otherwise, both the detection Hall element and the temperature monitor Hall element may be also operated with a constant voltage. In particular, when the Hall element is operated with a constant electric current, the change of the Hall voltage due to the temperature characteristic of the Hall element itself is small in comparison with a case in which the same Hall element is operated with a constant voltage. Accordingly, a sensor output having a characteristic more excellent in linearity with respect to the temperature change can be obtained.

As a replaced idea, the detection Hall element and the temperature monitor Hall element may be also connected in series to a driving power source. Otherwise, the detection Hall element and the temperature monitor Hall element may be also connected in parallel to the driving power source.

As a replaced idea, the semiconductor device may further have a substrate in which the detection Hall element and the temperature monitor Hall element are arranged. Both the detection Hall element and the temperature monitor Hall element are a vertical Hall element for detecting a magnetic field component in parallel to a substrate surface. As mentioned above, in the above vertical Hall element, a spreading way of a depletion layer is different in accordance with temperature. Accordingly, a bending degree of a curve showing the relation of temperature and the Hall element in the above temperature characteristic tends to be more emphasized. In this respect, in accordance with the above magnetic sensor, the change of the Hall voltage caused by the temperature characteristic can be also corrected on the basis of high accuracy by such a vertical Hall element. Further, the vertical Hall element can be generally formed on the substrate in a smaller element forming area in comparison with the lateral Hall element. Therefore, if the vertical Hall element is adopted as the above detection Hall element and the above temperature monitor Hall element, these Hall elements can be more closely arranged and a sensor output having a characteristic further excellent in linearity with respect to the temperature change can be also obtained.

In accordance with a second mode of the present disclosure, the magnetic sensor is constructed by a Hall element, a switching element and a calculation circuit. The Hall element detects a magnetic field emitted from a detection object. The Hall element has a driving signal supply terminal for outputting the Hall voltage and outputting the temperature monitor voltage. The switching element switches the output of the Hall voltage and the output of the temperature monitor voltage. The calculation circuit makes an arithmetic calculation for canceling the temperature characteristic of the Hall voltage on the basis of the Hall voltage and the temperature monitor voltage.

In accordance with the above construction, the Hall voltage outputted from the Hall element and the temperature monitor voltage taken out of a portion between the driving signal supply terminals of this Hall element as its inter-terminal voltage are switched and outputted by a switching means. An arithmetic calculation for canceling the temperature characteristics of these switched and outputted Hall voltage and temperature monitor voltage is made by these voltages. As mentioned above, with respect to the temperature monitor voltage taken out as the above inter-terminal voltage, its temperature coefficient with respect to temperature is reverse in comparison with the above Hall voltage. Accordingly, an arithmetic calculation for canceling the temperature characteristic can be made between these Hall voltage and temperature monitor voltage. The above sensor output obtained through such an arithmetic calculation also becomes a voltage having a characteristic naturally excellent in linearity with respect to the temperature change. Further, an arithmetic calculation for canceling the temperature characteristics of the Hall voltage and the temperature monitor voltage in the same Hall element is made by these voltages. Therefore, the sensor output has a characteristic more excellent in linearity with respect to the temperature change. Therefore, when an interpolation correction, etc. based on temperature with respect to the above sensor output are made, its accuracy is suitably maintained, and the change of the Hall voltage caused by the temperature characteristic can be corrected on the basis of high accuracy. As mentioned above, a spreading way of a depletion layer is different in accordance with temperature in the above vertical Hall element. Accordingly, a bending degree of a curve showing the relation of temperature and the Hall voltage in the above temperature characteristic tends to be more emphasized. In this respect, in accordance with the above magnetic sensor, the change of the Hall voltage caused by the temperature characteristic can be also corrected on the basis of high accuracy by such a vertical Hall element.

In accordance with a third mode of the present disclosure, the magnetic sensor is constructed by a detection Hall element for detecting a magnetic field emitted from a detection object, a temperature monitor element, and a calculation circuit. The detection Hall element is arranged near the temperature monitor element. The detection Hall element outputs an offset voltage. The temperature monitor element has a pair of driving signal supply terminals for outputting the temperature monitor voltage. The calculation circuit makes an arithmetic calculation for cancelling the temperature characteristic of the Hall voltage on the basis of the Hall voltage and the temperature monitor voltage.

With respect to the temperature monitor voltage taken out as the above inter-terminal voltage, its temperature coefficient with respect to temperature is normally reverse in comparison with the above Hall voltage. Further, when an offset is generated with respect to the detection Hall element, a similar offset is also generated with respect to the temperature monitor voltage. Accordingly, a sensor output for correcting the temperature characteristic and canceling the offset is obtained by arithmetically calculating these Hall voltage and temperature monitor voltage.

As a replaced idea, the temperature monitor element may be a Hall element and the detection Hall element may also have the same characteristic as the temperature monitor element. In accordance with this construction, the offset voltage and the temperature monitor voltage are obtained by mounting only the detection Hall element. The temperature characteristic can be corrected and the offset can be canceled, and an increase of a chip size can be restrained. Further, the temperature monitor Hall element may be also common to the detection Hall element.

As a replaced idea, the temperature monitor Hall element may also have a shape different from that of the detection Hall element. The temperature characteristics can be canceled by adjusting a coefficient with respect to the offset voltage and a coefficient with respect to the temperature monitor voltage. Accordingly, it is not necessary to conform the characteristics of the detection Hall element and the temperature monitor Hall element, and the magnetic sensor is easily manufactured.

As a replaced idea, the temperature monitor element may be also a resistor for monitoring temperature. This Hall element is equivalently represented as a bridge circuit. Accordingly, the sensor output for canceling the temperature characteristic is also obtained in a construction using a resistor instead of the Hall element.

In accordance with a fourth mode of the present disclosure, a physical quantity sensor is constructed by a first detection device for detecting a physical quantity according to a detection object, a second detection device for monitoring temperature, and a calculation circuit. The first detection device is constructed by one element equivalently shown as a bridge circuit, or plural elements constituting the bridge circuit. The second detection device is arranged near the first detection device. The second detecting circuit is constructed by one element equivalently shown as a bride circuit, or plural elements constituting the bridge circuit. The first detection device outputs a detection voltage according to the physical quantity. The second detection device has a pair of driving signal supply terminals for outputting the temperature monitor voltage. The calculation circuit makes an arithmetic calculation for canceling the temperature characteristic of the detection voltage on the basis of the detection voltage and the temperature monitor voltage.

With respect to the temperature monitor voltage taken out as the above inter-terminal voltage, its temperature coefficient with respect to temperature is normally reverse in comparison with the above detection voltage. Accordingly, as mentioned above, an arithmetic calculation for canceling the temperature characteristics can be made between these detection voltage and temperature monitor voltage. The above sensor output obtained through such an arithmetic calculation also becomes a voltage having a characteristic naturally excellent in linearity with respect to the temperature change. Therefore, when an interpolation correction, etc. based on temperature with respect to the above sensor output are made, its accuracy is suitably maintained. Accordingly, the change of the detection voltage caused by the temperature characteristic can be corrected on the basis of high accuracy.

As a replaced idea, each of the first detection device and the second detection device may be also a Hall element for detecting a magnetic field as a physical quantity. Otherwise, each of the first detection device and the second detection device may be also a strain gauge for detecting distortion according to pressure as the physical quantity. Accordingly, when the magnetic field is detected as the physical quantity and pressure is detected as the physical quantity, the change of the detection voltage caused by the temperature characteristic can be corrected on the basis of high accuracy.

As a replaced idea, the first detection device may also have an electric characteristic different from that of the second detection device. The temperature characteristics can be canceled by adjusting a coefficient with respect to the detection voltage and a coefficient with respect to the temperature monitor voltage. Accordingly, it is not necessary to conform the characteristics of the first detection device for detecting the physical quantity and the second detection device for monitoring temperature, and the sensor can be easily manufactured.

In accordance with a fifth mode of the present disclosure, a physical quantity sensor is constructed by a detection device for detecting a physical quantity according to a detection object and monitoring temperature, and a calculation circuit. The detection device is constructed by one element equivalently shown as a bridge circuit, or plural elements constituting the bridge circuit. The detection device outputs a detection voltage according to the physical quantity. The detection device has a pair of driving signal supply terminals for outputting the temperature monitor voltage. The calculation circuit makes an arithmetic calculation for canceling the temperature characteristic of the detection voltage on the basis of the detection voltage and the temperature monitor voltage.

In accordance with the above construction, an arithmetic calculation for canceling the temperature characteristics of the detection voltage outputted from the detection device and the temperature monitor voltage taken out of a portion between the driving signal supply terminals of this detection device as its inter-terminal voltage is made by these voltages. As mentioned above, with respect to the temperature monitor voltage taken out as the above inter-terminal voltage, its temperature coefficient with respect to temperature is reverse in comparison with the above detection voltage. Accordingly, an arithmetic calculation for canceling the temperature characteristics can be made between these detection voltage and temperature monitor voltage. The above sensor output obtained through such an arithmetic calculation also becomes a voltage having a characteristic naturally excellent in linearity with respect to the temperature change. Further, an arithmetic calculation for canceling the temperature characteristics of the detection voltage and the temperature monitor voltage in the same detection device is made by these voltages. Therefore, the sensor output has a characteristic more excellent in linearity with respect to the temperature change. Therefore, when an interpolation correction, etc. based on temperature with respect to the above sensor output are made, its accuracy is suitably maintained. The change of the detection voltage caused by the temperature characteristic can be corrected on the basis of high accuracy.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A magnetic sensor comprising:
   a Hall element for detecting a magnetic field generated from a detection object, wherein the Hall element outputs a Hall voltage, and includes a pair of driving signal supply terminals for outputting a temperature monitor voltage;
   a switching element for switching between an output of the Hall voltage and an output of the temperature monitor voltage; and
   a calculation circuit, wherein
   the calculation circuit calculates to cancel a temperature characteristic of the Hall voltage based on the Hall voltage and the temperature monitor voltage
   the calculation circuit is an adder circuit for adding the temperature monitor voltage to the Hall voltage; and
   the switching circuit is coupled with a pair of input terminals of the adder circuit so that the Hall voltage and the temperature monitor voltage are alternatively input into the adder circuit.

2. The sensor according to claim 1, wherein the Hall element is operated with a constant current.

3. The sensor according to claim 1, wherein the Hall element is operated with a constant voltage.

4. The semiconductor device according to claim 1, further comprising:
   a substrate, in which the Hall element is disposed, and
   the Hall element is a vertical Hall element for detecting a magnetic field component in parallel to a substrate surface.

5. The sensor according to claim 1, wherein
   the calculation circuit further includes a sampling hold circuit for holding the temperature monitor voltage as when the switching element switches to the output of the temperature monitor voltage, and wherein
   adder circuit adds the Hall voltage and the temperature monitor voltage, the Hall voltage being input from the switching element when the switching element switches to the output of the Hall voltage, and the temperature monitor voltage being held in the sampling hold circuit.

6. The sensor according to claim 5, wherein
   the Hall voltage is exponentially reduced as temperature rises, and wherein
   the temperature monitor voltage is exponentially increased as temperature rises.

* * * * *